(12) United States Patent
Kimura

(10) Patent No.: US 10,873,300 B2
(45) Date of Patent: Dec. 22, 2020

(54) SEMICONDUCTOR DEVICE, CURRENT DETECTING METHOD, AND LOAD DRIVE SYSTEM

(71) Applicant: RENESAS ELECTRONICS CORPORATION, Tokyo (JP)

(72) Inventor: Keisuke Kimura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 163 days.

(21) Appl. No.: 16/242,722

(22) Filed: Jan. 8, 2019

(65) Prior Publication Data

US 2019/0238100 A1 Aug. 1, 2019

(30) Foreign Application Priority Data

Jan. 30, 2018 (JP) .................. 2018-013305

(51) Int. Cl.

| H02H 7/00 | (2006.01) |
|---|---|
| H03F 1/32 | (2006.01) |
| G01R 31/40 | (2020.01) |
| H01F 7/18 | (2006.01) |
| G01R 19/00 | (2006.01) |
| G01R 19/10 | (2006.01) |
| H01F 7/06 | (2006.01) |
| H03F 3/45 | (2006.01) |

(52) U.S. Cl.
CPC ....... *H03F 1/3211* (2013.01); *G01R 19/0092* (2013.01); *G01R 19/10* (2013.01); *G01R 31/40* (2013.01); *H01F 7/064* (2013.01); *H01F 7/1844* (2013.01); *H03F 3/45475* (2013.01)

(58) Field of Classification Search
None
See application file for complete search history.

(56) References Cited

U.S. PATENT DOCUMENTS 6,377,034 B1    4/2002 Ivanov
9,024,600 B2 *  5/2015 Wiktor ................. H02M 3/157
                                                    323/272

(Continued)

FOREIGN PATENT DOCUMENTS

JP    2016-201646 A    12/2016
JP    2017-175746 A    9/2017

*Primary Examiner* — Stephen W Jackson
(74) *Attorney, Agent, or Firm* — McDermott Will & Emery LLP

(57) ABSTRACT

A semiconductor device has a drive transistor coupled to a load and a current detection circuit. The current detection circuit includes: an operational amplifier amplifying a potential difference between voltage of a first terminal and voltage of a second terminal; a sense transistor passing sense current between the first terminal and the drive transistor; a voltage supply circuit having a first current source and supplying voltage higher than voltage supplied to the grounding voltage terminal to the second terminal; a third terminal outputting current based on the sense current; a second current source coupled between the third terminal and the grounding voltage terminal; and a current source control circuit controlling current of the first and second current sources. Detection current detected by the current detection circuit is current obtained by subtracting the current of the second current source from the current based on the sense current.

20 Claims, 31 Drawing Sheets

(56) References Cited

U.S. PATENT DOCUMENTS

| | | | |
|---|---|---|---|
| 9,429,971 B2 * | 8/2016 | Mallala | G05F 1/569 |
| 10,566,940 B2 * | 2/2020 | Ramorini | G01R 19/0092 |
| 2016/0300653 A1 | 10/2016 | Kondo et al. | |
| 2017/0279357 A1 | 9/2017 | Tajima | |

* cited by examiner

SEMICONDUCTOR DEVICE, CURRENT DETECTING METHOD, AND LOAD DRIVE SYSTEM

CROSS-REFERENCE TO RELATED APPLICATIONS

The disclosure of Japanese Patent Application No. 2018-013305 filed on Jan. 30, 2018 including the specification, drawings and abstract is incorporated herein by reference in its entirety.

BACKGROUND

The present disclosure relates to a semiconductor device and can be applied to, for example, a semiconductor device controlling a solenoid valve mounted in a vehicle such as a car.

In recent years, in a car, a solenoid valve is used to control the operation of a power train which is mounted. For example, a method of controlling drive force transmission at the time of changing speed of a transmission by changing the position of a clutch which transmits drive force from an engine to the transmission by a solenoid valve is known.

The opening/closing of a solenoid valve is controlled, generally, by supplying or interrupting current to a solenoid. Therefore, to preferably control the solenoid valve, it is requested to detect the current which is supplied to the solenoid with high precision. To achieve it, a current detection circuit detecting current which is supplied to a solenoid is proposed (Japanese Unexamined Patent Application Publication No. 2016-201646 (patent literature 1)). The current detection circuit of the patent literature 1 detects current which is supplied to the solenoid by a detection resistor provided between the solenoid driver and an output terminal.

There is a current detection circuit which uses a sense transistor detecting current of a drive transistor in a DC-DC converter (Japanese Unexamined Patent Application Publication No. 2017-175746 (patent literature 2)). An operational amplifier is used in the current detection circuit of the patent literature 2. An intentional offset is applied to one end of input of the operational amplifier to detect the current of the drive transistor on the low side even when there is an offset in the operational amplifier.

PATENT LITERATURE

Patent literature 1: Japanese Unexamined Patent Application Publication No. 2016-201646
Patent literature 2: Japanese Unexamined Patent Application Publication No. 2017-175746
Patent literature 3: U.S. Pat. No. 6,377,034

SUMMARY

In a current detection circuit of applying an intentional offset to one end of an operational amplifier like in the patent literature 2, when load current becomes large, a nonlinear error occurs.

The other problems and novel features will become apparent from the description of the present disclosure and appended drawings.

Outline of representative one in the present disclosure will be briefly described as follows.

A semiconductor device has a drive transistor coupled to a load and a current detection circuit. The current detection circuit includes: an operational amplifier amplifying a potential difference between voltage of a first terminal and voltage of a second terminal; a sense transistor passing sense current between the first terminal and the drive transistor; a voltage supply circuit having a first current source coupled between a power supply voltage terminal and the second terminal and supplying voltage higher than voltage supplied to the grounding voltage terminal to the second terminal; a third terminal outputting current based on the sense current; a second current source coupled between the third terminal and the grounding voltage terminal; and a current source control circuit controlling current of the first and second current sources. Detection current detected by the current detection circuit is current obtained by subtracting the current of the second current source from the current based on the sense current.

According to the semiconductor device, a nonlinear error can be reduced.

BRIEF DESCRIPTION OF THE DRAWINGS

FIG. 21 is a diagram illustrating a current path in the case where the low-side driver in the current detection circuit of the low-side driver of FIG. 20 is on.

FIG. 22 is a diagram illustrating a current path in the case where a high-side driver in the current detection circuit of the low-side driver of FIG. 20 is on.

DETAILED DESCRIPTION

Figure 1A:
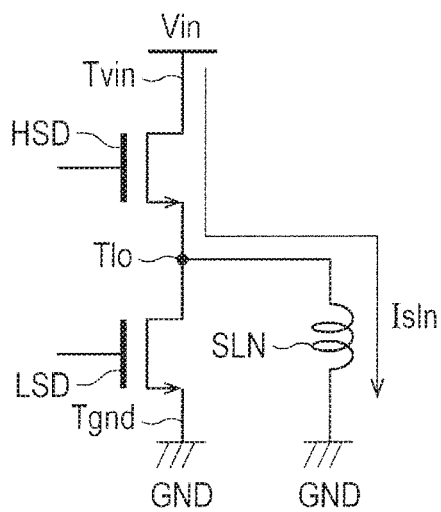
FIGS. 1A to 1D are diagrams illustrating operation states of a solenoid driver.

Hereinafter, a comparative example, an embodiment, and modifications will be described by using the drawings. In the following description, the same reference numerals are designated to the same components and repetitive description may not be given.

Figure 1C:
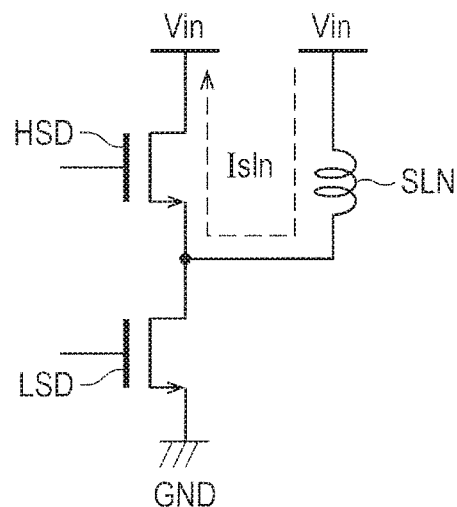
Figure 1B:
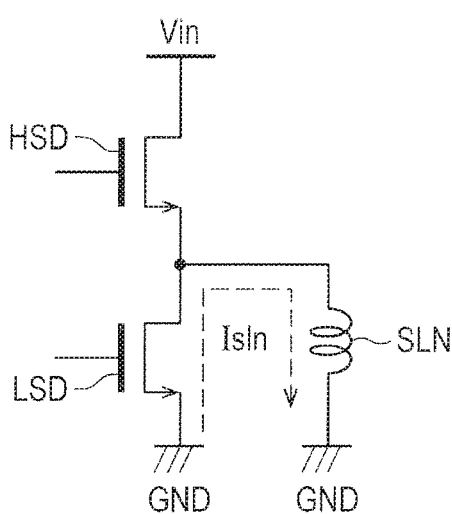
Figure 1D:
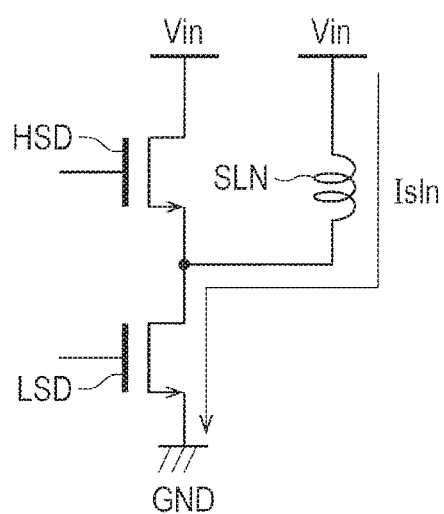

First, the operation states of a solenoid driver will be described with reference to FIGS. 1A to 1D. FIGS. 1A to 1D are diagrams illustrating operation states of a solenoid driver. FIG. 1A is a diagram illustrating a drive operation in high-side driving, FIG. 1B is a diagram illustrating a regeneration operation in the high-side driving, FIG. 1C is a diagram illustrating a regeneration operation in the low-side driving, and FIG. 1D is a diagram illustrating a driving operation in the low-side driving.

The solenoid driver has a high-side driver HSD provided between an input voltage terminal Tvin to which input voltage (Vin) is supplied and an external output terminal Tlo, and a low-side driver LSD provided between a grounding voltage terminal Tgnd to which grounding voltage (GND) is supplied and the external output terminal Tlo. Solenoid driving methods include high-side driving and low-side driving which is determined whether a solenoid SLN is coupled to the grounding voltage (GND) or the input voltage (Vin). In driving operation in the high-side driving, as illustrated in FIG. 1A, the high-side driver HSD is made conductive, and current (Isln) is passed and stored in the solenoid SLN via the external output terminal Tlo. In the driving operation in the low-side driving, as illustrated in FIG. 1D, the low-side driver LSD is made conductive, current (Isln) is passed from the power supply to the solenoid SLN, and stored. In regeneration operation in the high-side driving, as illustrated in FIG. 1B, the low-side driver LSD is made conductive, and current is passed to the solenoid SLN. In regeneration operation in the low-side driving, as illustrated in FIG. 1C, the high-side driver HSD is made conductive, and current is drawn from the solenoid SLN.

Since coupling of the solenoid SLN does not dynamically change in the system, the solenoid driver is not always adapted to both the high-side driving and the low-side driving. On the other hand, there is a demand for a product which is adapted to both the high-side driving and the low-side driving as a solenoid driver. Consequently, in some cases, the solenoid driver has to be adapted to both the high-side driving and the low-side driving.

As current detection circuits of the solenoid driver, there can be four kinds: a current detection circuit of a high-side driver and a current detection circuit of a low-side driving adapted to the high-side driving; and a current detection circuit of a high-side driver and a current detection circuit of a low-side driver adapted to the low-side driving.

The current detection circuit is a circuit detecting current flowing between the drain and the source of a MOS transistor as a component of the high-side driver HSD or current flowing between the drain and the source of a MOS transistor as a component of the low-side driver LSD.

Figure 2:
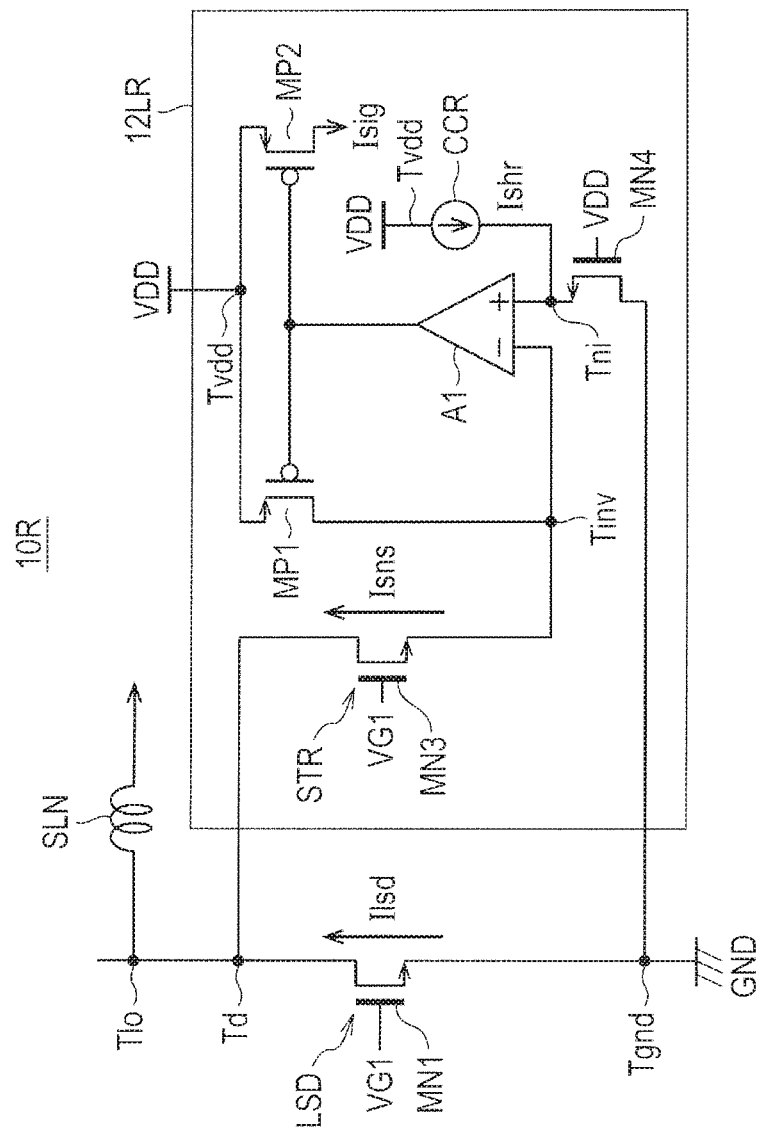
FIG. 2 is a circuit diagram illustrating a semiconductor device of a first comparative example.

An example (first comparative example) of a semiconductor device having a current detection circuit of a low-side driver adapted to the high-side driving will be described with reference to FIG. 2. FIG. 2 is a circuit diagram of a semiconductor device of the first comparative example.

A semiconductor device 10R of the first comparative example has a transistor MN1 of the low-side driver LSD and a current detection circuit 12LR as a part of components provided for a solenoid driver. The current detection circuit 12LR has a transistor MN3 of a sense transistor STR, transistors MN4, MP1, and MP2, a first operational amplifier A1, and a constant current source CCR. In FIG. 2, the solenoid SLN is also illustrated.

In the current detection circuit 12LR, the transistor MN3 is comprised of an N-channel MOS transistor of high withstanding voltage like the transistor MN1. For example, the transistor size of the transistor MN3 is $1/1000$ of that of the transistor MN1.

The transistor MN3 is provided on a current path between a power supply voltage terminal Tvdd to which the power supply voltage (VDD) is supplied and the drain (terminal Td) of the transistor MN1, and a pulse signal (VG1) is supplied to the gate.

The first operational amplifier A1 amplifies the potential difference between the voltage supply circuit supplying a voltage higher than the source voltage (that is, grounding voltage (GND)) of the transistor MN1 and the source voltage of the transistor MN3. The first operational amplifier A1 is comprised of a transistor of low withstand voltage.

The gate-source voltage and the drain-source voltage of the transistor MN3 have the same values as the gate-source voltage and the drain-source voltage of the transistor MN1, respectively. Consequently, between the drain and the source of the transistor MN3, current (Isns) proportional to current (Ilsd) flowing between the drain and the source of the transistor MN1 flows. In the comparison example, Isns=(1/1000)Ilsd.

The voltage supply circuit has the transistor MN4 and the constant current source CCR. The transistor MN4 is comprised of, for example, an N-channel MOS transistor of high withstand voltage of the same size as that of the transistor MN3. The transistor MN4 is provided between the non-inversion input terminal Tni of the first operational amplifier A1 and the grounding voltage terminal Tgnd and, as the power supply voltage (VDD) is supplied to the gate, is always in an on state. That is, the transistor MN4 functions as a resistive element.

The constant current source CCR is provided between the power supply voltage terminal Tvdd and the non-inversion input terminal Tni of the first operational amplifier A1 and supplies current (Ishr) to the non-inversion input terminal Tni of the first operational amplifier A1. Consequently, voltage higher than the grounding voltage (GND) by predetermined voltage is supplied to the non-inversion input terminal Tni of the first operational amplifier A1, and an intentional offset is applied.

Figure 3:
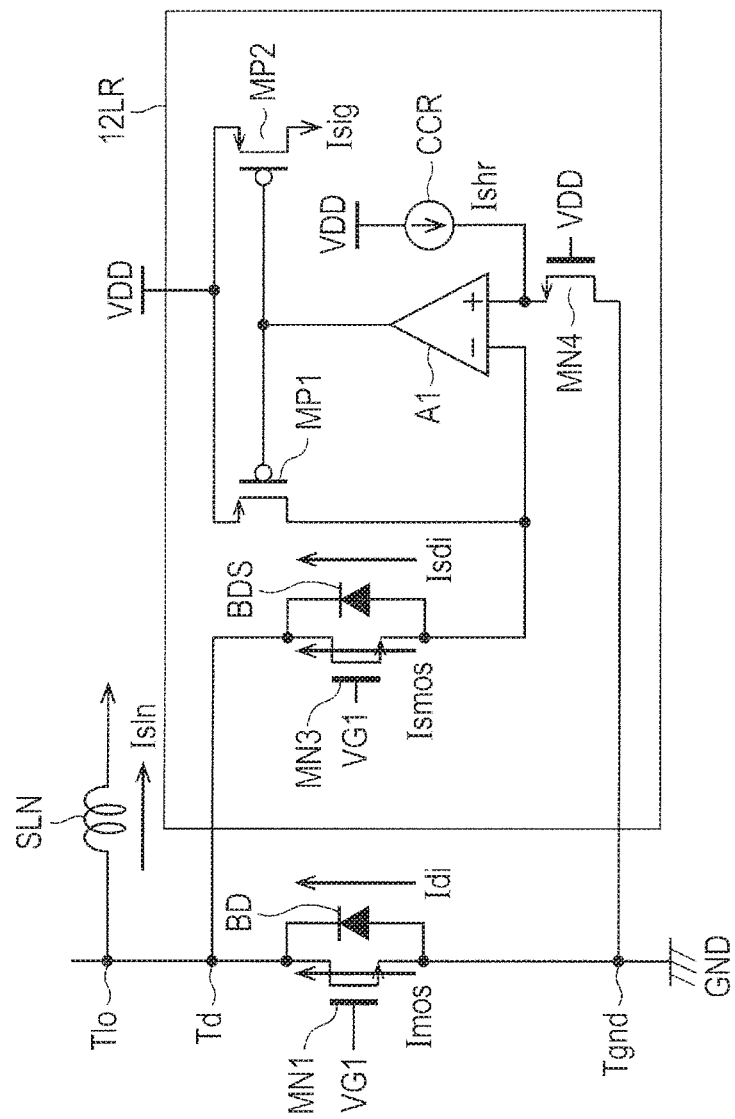
FIG. 3 is an equivalent circuit diagram in which the device structure of a current detection circuit in FIG. 2 is considered.
Figure 4A:
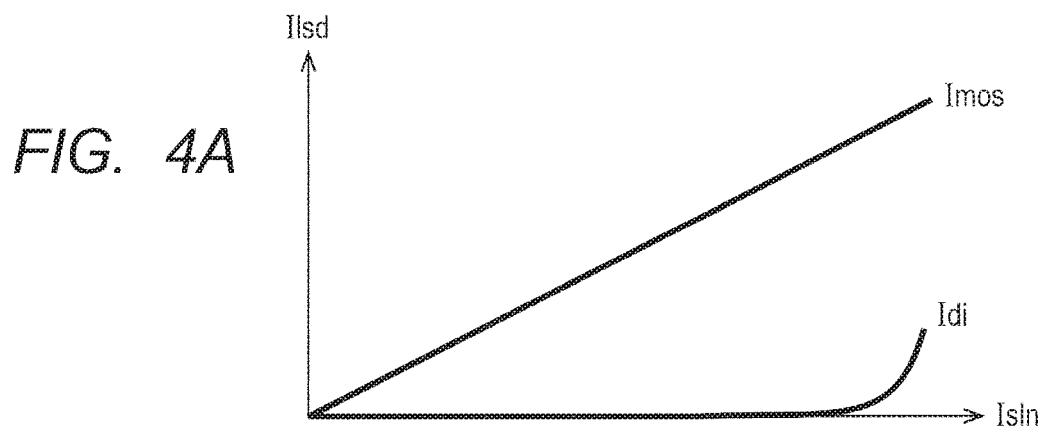
FIGS. 4A to 4C are diagrams illustrating a mechanism causing a nonlinear error.
Figure 4B:
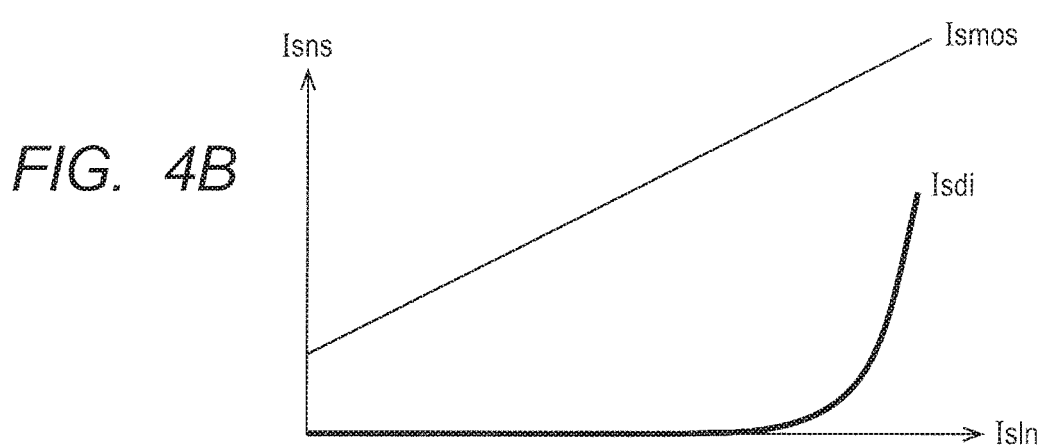
Figure 4C:
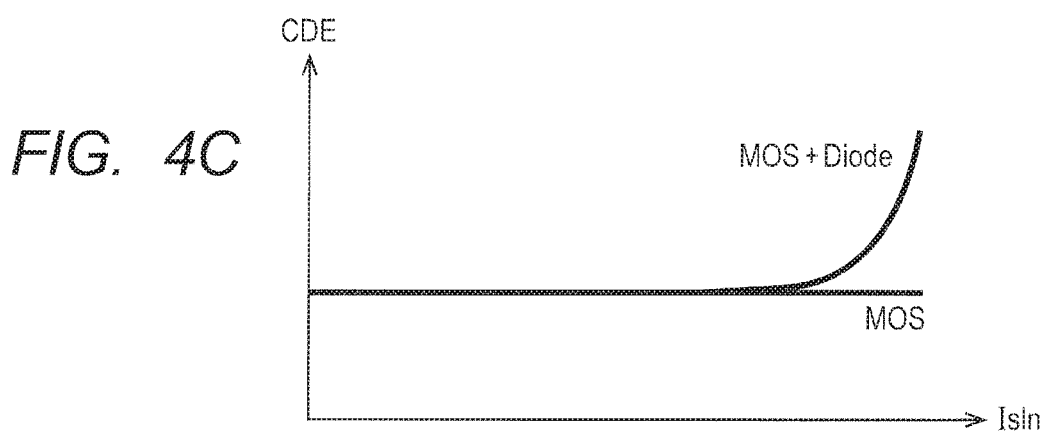

Next, a mechanism in which the above-described nonlinear error occurs will be described with reference to FIG. 3 and FIGS. 4A to 4C. FIG. 3 is an equivalent circuit diagram in which the device structure of a current detection circuit in FIG. 2 is considered. FIG. 4A is a diagram illustrating the relation between low-side driver current and solenoid current, FIG. 4B is a diagram illustrating the relation between sense transistor current and solenoid current, and FIG. 4C is a diagram illustrating the relation between a current detection error and solenoid current.

Each of the low-side driver LSD and the sense transistor STR is comprised of a MOS transistor of high withstand voltage. The MOS transistors of high withstand voltage are roughly divided into a vertical-type MOS transistor and a horizontal-type MOS transistor. In the vertical-type MOS transistor, the gate electrode and the source electrode are formed in the surface of a semiconductor chip, and the drain electrode is formed in the rear face. In the horizontal-type MOS transistor, the gate electrode, the source electrode, and the drain electrode are formed in the surface of a semiconductor chip. In any of the vertical-type MOS transistor and the horizontal-type MOS transistor, in the structure of a MOS transistor of high withstand voltage, a body diode as a parasitic diode is formed in parallel to the MOS transistor as the main body. Therefore, as illustrated in FIG. 3, the low-side driver LSD is configured by coupling the body diode BD in parallel to the transistor MN1. The sense transistor STR is configured by coupling the body diode BDS in parallel to the transistor MN3.

The current (Ilsd) flowing in the low-side driver LSD is the total of the current (Imos) flowing between the source and the drain of the transistor MN1 and the current (Idi) flowing in the body diode BD. As illustrated in FIG. 4A, the current (Imos) increases in proportion to the solenoid current (Isln) (has linearity) whereas the current (Idi) sharply increases (has nonlinearity) when the solenoid current (Isln) increases.

The sense current (Isns) flowing in the sense transistor STR is the total of the current (Ismos) flowing between the source and the drain of the transistor MN3 and the current (Idis) flowing in the body diode BDS. As illustrated in FIG. 4B, the current (Ismos) increases in proportion to the solenoid current (Isln) (has linearity) whereas the current (Isdi) sharply increases (has nonlinearity) when the solenoid current (Isln) increases.

Since the input of the first operational amplifier A1 is different from the grounding voltage (GND) when an intentional offset is applied, Vds of the low-side driver LSD and Vds of the sense transistor STR are not equal. Therefore, as illustrated in FIGS. 4A and 4B, the ratio between the current (Idi) flowing in the body diode BD of the low-side driver LSD and the current (Isdi) flowing in the body diode BDS of the sense transistor STR does not become the sense ratio. As a result, as illustrated in FIG. 4C, the current detection error (CDE) becomes nonlinear when the solenoid current (Isln) is large, and a nonlinear error occurs in the current detection circuit.

Since an intentional offset is applied, the graph of the current (Isns) of the sense transistor STR in FIG. 4B is obtained by shifting the graph of the current (Ilsd) of the low-side driver LSD in FIG. 4A to the left. The scale of the vertical axis is different. Therefore, the solenoid current (Isln) by which current starts to flow in the body diodes BD and BDS in the low-side driver LSD and that in the sense transistor STR are different.

As the current detection error (CDE) in FIG. 4C, in a MOS transistor (MOS) only, there is only an intentional offset which is constant and can be subtracted at a later stage. However, a MOS transistor having the body diodes BD and BDS (MOS+ diode) has a nonlinear curve and it is difficult to subtract it at a later stage. Since the nonlinear curve fluctuates depending on PVT (process condition, power supply voltage condition, and temperature condition), it cannot be simply subtracted. For regeneration operation, the body diode BD is necessary. When the body diode BD as a parasite diode is not formed in the transistor, a diode is provided externally. Also in this case, a similar nonlinear error occurs.

Consequently, the current detection circuit of the embodiment has the circuit for applying an intentional offset. Specifically, a first current source for applying, for example, a positive offset is coupled to one of inputs of a differential amplifier of the current detection circuit, and a second current source for adding, for example, a negative offset is coupled to the output of the current detection circuit. The sense transistor which is coupled to the other input of the differential amplifier prevents an inverse bias, and prevents that current measurement cannot be made. The amount of an offset is adjusted according to the current to be detected. Therefore, a nonlinear error of the current detection circuit using the sense transistor can be reduced.

Example

Figure 5:
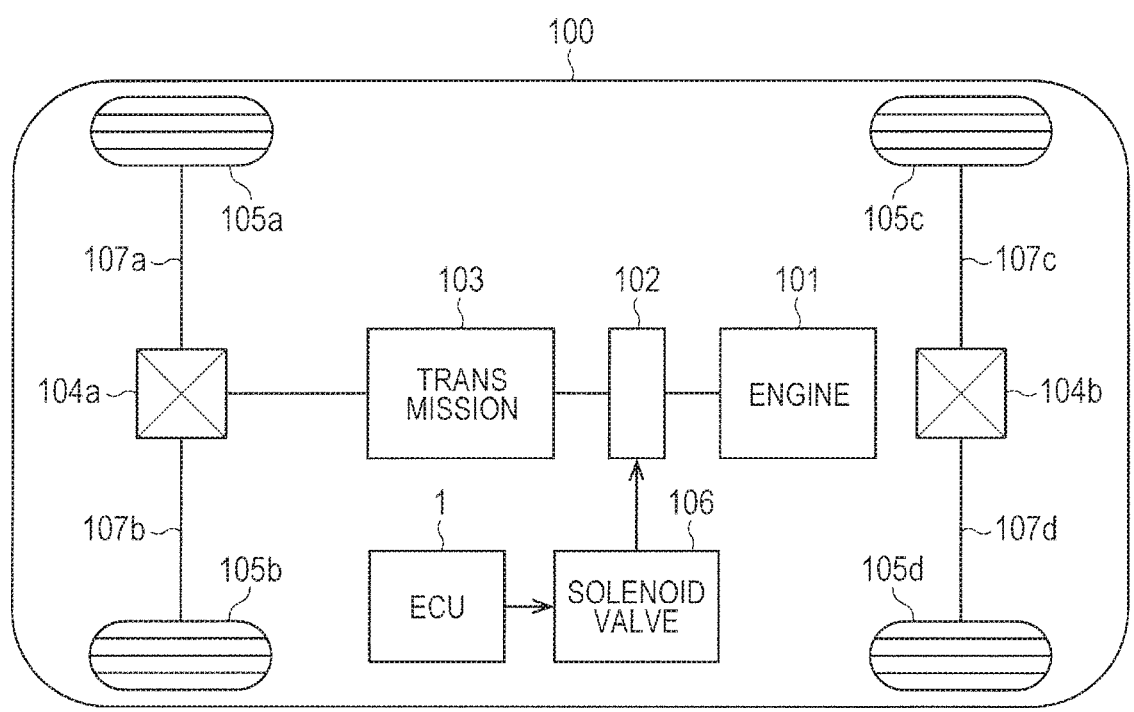
FIG. 5 is a diagram schematically illustrating an example of a drive system of a car in which the semiconductor device of an example is assembled.
Figure 6:
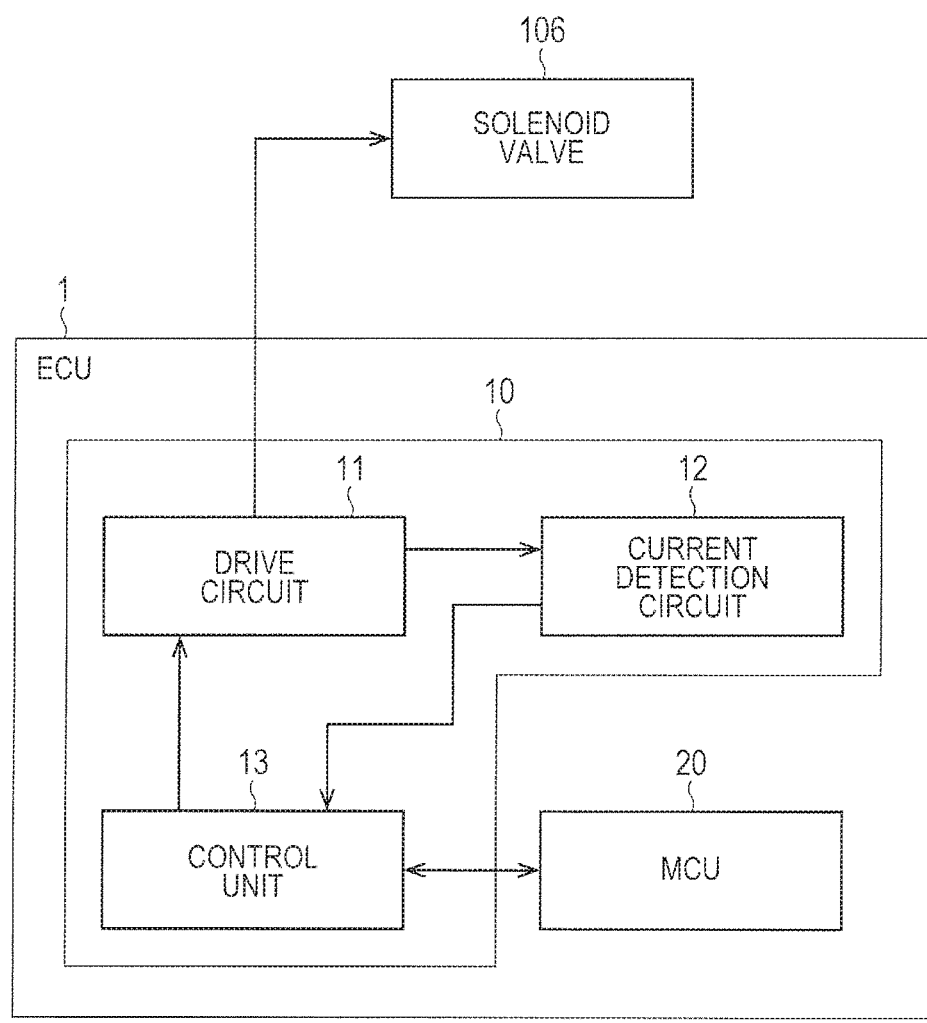
FIG. 6 is a block diagram illustrating the configuration of an ECU in FIG. 5.

A semiconductor device of an example will be described. First, an example of a use mode of the semiconductor device will be described with reference to FIGS. 5 and 6. FIG. 5 is a diagram schematically illustrating an example of a drive system of a car in which the semiconductor device of the embodiment is assembled. FIG. 6 is a block diagram illustrating the configuration of an ECU in FIG. 5.

As illustrated in FIG. 5, the drive system of a car 100 has an engine 101, a clutch 102, a transmission 103, differential gears 104a and 104b, drive wheels 105a and 105b, wheels 105c and 105d, a solenoid valve 106, shafts 107a to 107d, and an electronic control unit (ECU) 1.

As the engine 101, various engines generating drive force can be used. The engine 101 transmits the generated drive force to the transmission 103 via the clutch 102. The transmission 103 transmits the drive force to the drive wheel 105a via the differential gear 104a and the shaft 107a, and transmits the drive force to the drive wheel 105b via the differential gear 104a and the shaft 107b. The wheel 105c is coupled to the differential gear 104b via the shaft 107c, and the wheel 105d is coupled to the differential gear 104b via the shaft 107d.

The ECU 1 is a unit controlling the solenoid valve 106. As illustrated in FIG. 6, the ECU 1 has a semiconductor device 10 and a microcontroller (MCU) 20 controlling the semiconductor device 10. The semiconductor device 10 has a drive circuit 11, a current detection circuit 12, and a control unit 13 controlling the drive circuit 11. By controlling the current given to the solenoid SLN (refer to FIG. 7) of the solenoid valve 106, the opening/closing of the solenoid valve 106 is controlled. In this example, by opening/closing the solenoid valve 106, the position of the clutch 102 can be changed. That is, by controlling opening/closing of the solenoid valve 106, the semiconductor device 10 can control the transmission of the drive force from the engine 101 to the transmission 103. The microcontroller 20 is a semiconductor integrated circuit device having a CPU (not illustrated) and a memory (not illustrated) in a single semiconductor chip.

As will be described later, by controlling the solenoid current with precision, the vibration when the transmission 103 switches the gear can be reduced. As a result, a car with little vibration and comfortable ride can be realized.

Figure 7:
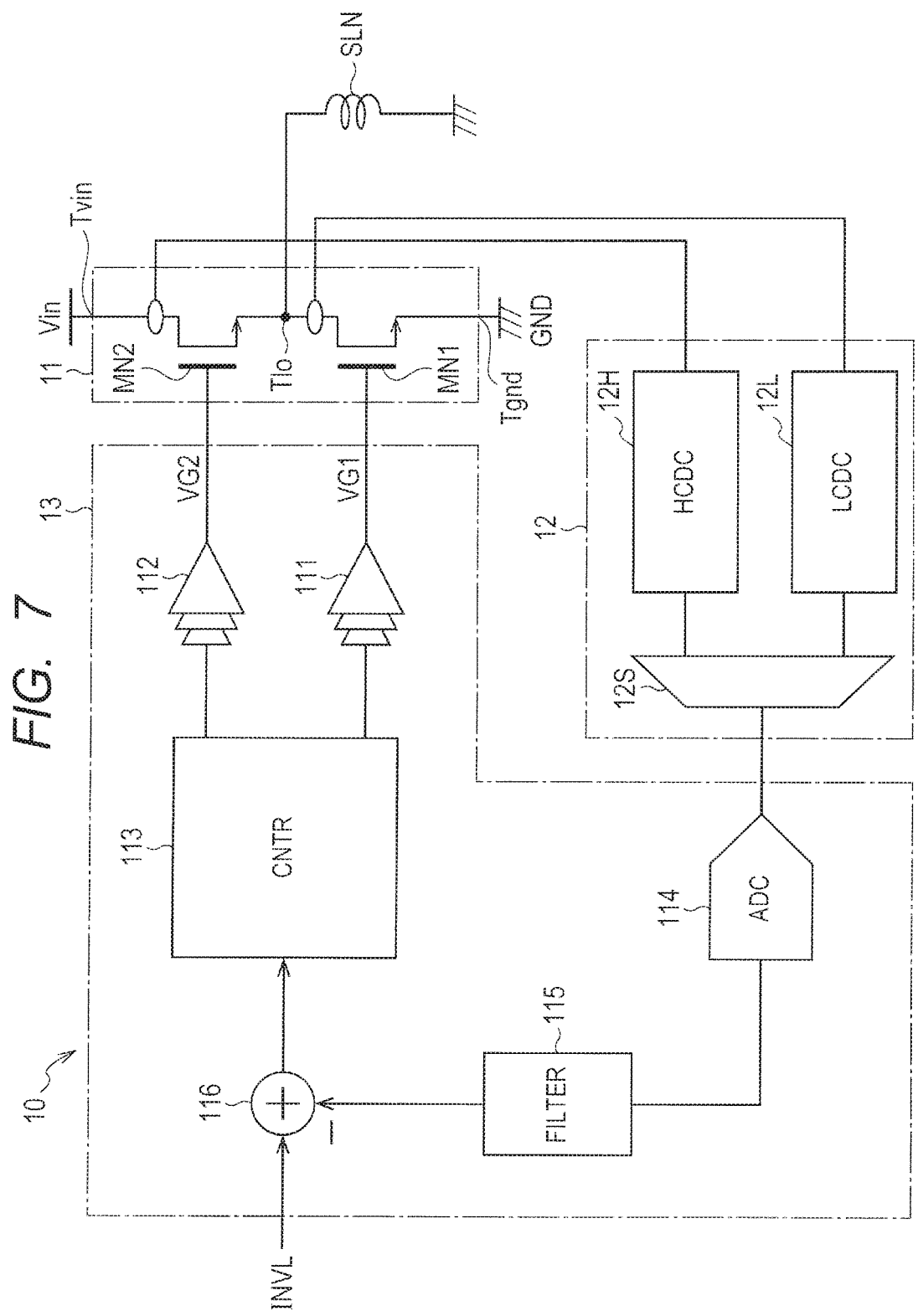
FIG. 7 is a block diagram illustrating the configuration of a semiconductor device in FIG. 6.

Next, the semiconductor device 10 will be described with reference to FIG. 7. FIG. 7 is a block diagram illustrating the configuration of the semiconductor device in FIG. 6. FIG. 7 also illustrates the solenoid SLN.

The semiconductor device 10 has, on one semiconductor chip, the drive circuit 11 having transistors MN1 and MN2, the current detection circuit 12, and the control unit 13 having pre-drivers 111 and 112, an analog/digital converter (ADC) 114, a filter 115, and an addition circuit 116. For example, the semiconductor device 10 is configured as an electronic circuit formed on a silicon substrate or a compound semiconductor substrate. The semiconductor device 10 high-side-drives the solenoid SLN.

The transistor MN1 is a low-side driver (first drive transistor) of the drive circuit 11 and is comprised of an N-channel MOS transistor of high withstand voltage. The transistor MN2 is a high-side driver (second drive transistor) of the drive circuit 11 and is comprised of an N-channel MOS transistor of high withstand voltage.

More specifically, in the transistor MN1, the drain is coupled to the external output terminal Tlo, the source is coupled to the grounding voltage terminal Tgnd, and a pulse signal (VG1) from the control unit 13 is supplied to the gate. In the transistor MN2, the drain is coupled to the input voltage terminal Tvin, the source is coupled to the external output terminal Tlo, and a pulse signal (VG2) from the control unit 13 is supplied to the gate. The grounding voltage (GND) is supplied to the grounding voltage terminal Tgnd, and the input voltage (Vin) from the outside is supplied to the input voltage terminal Tvin. The external output terminal Tlo is coupled to one end of the solenoid SLN. The other end of the solenoid SLN is coupled to the grounding voltage (GND).

In the drive circuit 11, on/off of the transistors MN1 and MN2 is complementarily controlled while sandwiching deadtime. For example, first, when the transistor MN2 is turned on and becomes conductive and the transistor MN1 is turned off and becomes nonconductive, current flows from the input voltage terminal Tvin to the solenoid SLN via the transistor MN2 and the external output terminal Tlo. At this time, current energy is stored in the solenoid SLN. After that, when the transistor MN2 is turned off and the transistor MN1 is turned on, the current flowing from the input voltage terminal Tvin toward the solenoid SLN via the transistor MN2 is interrupted. The solenoid SLN releases the stored current energy toward the grounding voltage terminal to which the solenoid SLN is coupled so as to maintain the current value of the current which flowed just before. Consequently, the current flows from the grounding voltage terminal Tgnd toward the solenoid SLN via the transistor MN1.

The current detection circuit 12 has a current detection circuit (HCDC) 12H of the high-side driver, a current detection circuit (LCDC) 12L of the low-side driver, and a synthesizing unit 12S. The synthesizing unit 12S includes a switch for switching the detection current of the current detection circuit 12H and the detection current of the current detection circuit 12L. The details of the current detection circuit 12L will be described later.

The control unit 13 has the pre-drivers 111 and 112, the control circuit (CNTR) 113, the analog/digital converter (ADC) 114, the filter 115, and the addition circuit 116. The analog/digital converter 114 converts a detection result (voltage value) based on the current detected by the current detection circuit 12 to a digital detection signal. The digital detection signal averages the current detection result of one cycle (on/off of the transistor MN1) by the filter 115, increases/decreases an instruction value (INVL) from the MCU 20 by the addition circuit 116, and the resultant is transmitted to the control circuit 113.

The control circuit 113 monitors the currents of the transistors MN1 and MN2 of the drive circuit 11 by monitoring the detection result of the current detection circuit 12. The control circuit 113 performs PWM (Pulse Width Modulation)-control on the transistors MN1 and MN2 in accordance with the monitor result, thereby complementarily turning on/off the transistors MN1 and MN2 via the pre-drivers 111 and 112, and controls so that the currents (solenoid current (Isln)) of the transistors MN1 and MN2 converge to a target value.

As will be described later, by detecting the current of the solenoid driver with precision by the current detection circuit 12L, the solenoid current can be controlled with precision.

Figure 8:
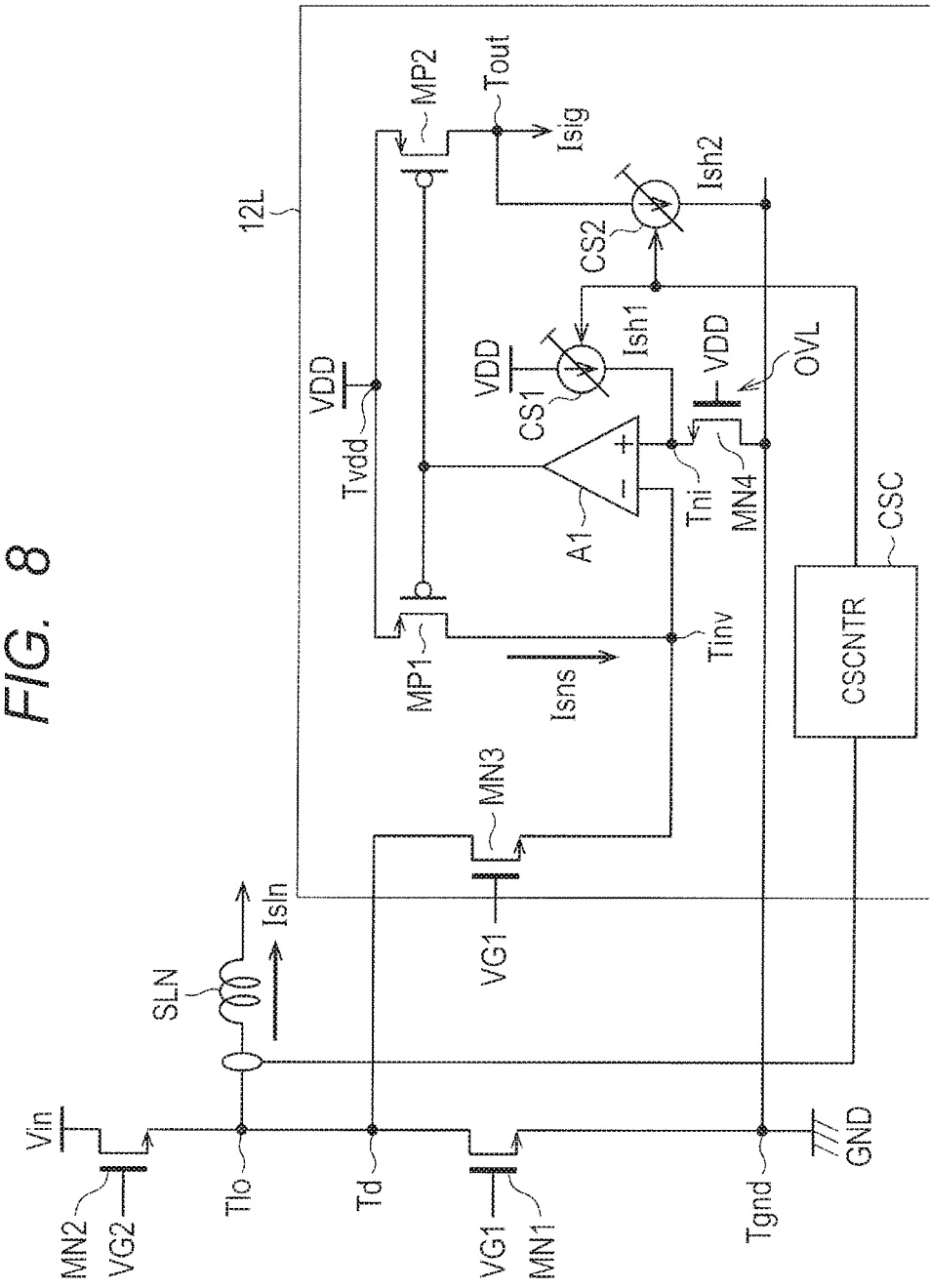
FIG. 8 is a circuit diagram illustrating a current detection circuit of a low-side driver in FIG. 7.
Figure 9:
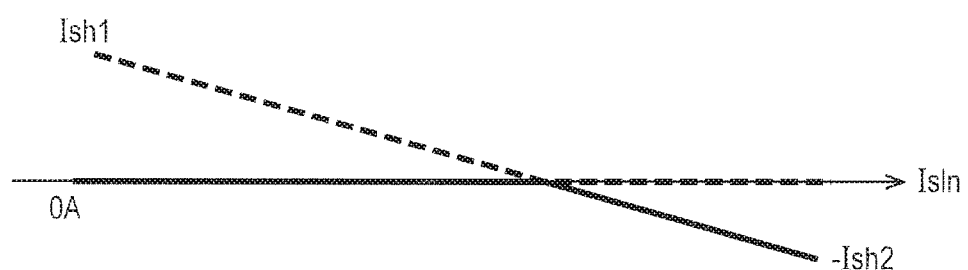
FIG. 9 is a diagram illustrating the relation between currents of first and second current sources and solenoid current in FIG. 8.

Next, the current detection circuit of the low-side driver of high-side driving will be described with reference to FIGS. 8 and 9. FIG. 8 is a circuit diagram illustrating a current detection circuit of the low-side driver in FIG. 7. FIG. 9 is a diagram illustrating the relation between currents of first and second current sources and solenoid current in FIG. 8.

As illustrated in FIG. 8, the current detection circuit 12L has transistors MN3, MN4, MP1, and MP2, the first operational amplifier A1, a first current source CS1, a second current source CS2, and a current source control circuit (CSCNTR) CSC. FIG. 8 also illustrates the transistor MN1 on the low side and the transistor MN2 on the high side as a part of components provided for the drive circuit 11, and the solenoid SLN of the solenoid valve 106. In FIG. 8, a body diode as a parasitic diode formed in the transistors MN1, MN2, and MN3 is not illustrated. It is not illustrated similarly in the following embodiments and modifications.

In the current detection circuit 12L, the transistor MN3 is a sense transistor comprised of an N-channel MOS transistor of high withstand voltage like the transistor MN1. For example, the transistor size of the transistor MN3 is 1/N (for example, N=1000) of that of the transistor MN1.

The transistor MN3 is provided on the current path between the power supply voltage terminal Tvdd to which the power supply voltage (VDD) is supplied and the drain (terminal Td) of the transistor MN1, and the pulse signal (VG1) is supplied to the gate.

The first operational amplifier A1 has the inversion input terminal Tinv as the first terminal and the non-inversion input terminal Tni as the second terminal and amplifies the potential difference between the voltage supply circuit OVL supplying voltage higher than the source voltage of the transistor MN1 (that is, the grounding voltage (GND)) and the source voltage of the transistor MN3. The first operational amplifier A1 is comprised of a transistor of low withstand voltage.

The gate-source voltage and the drain-source voltage of the transistor MN3 have the same values as the gate-source voltage and the drain-source voltage of the transistor MN1, respectively. Consequently, between the drain and the source of the transistor MN3, current (in the embodiment, current of 1/N (for example, N=1000)) proportional to the current flowing between the drain and the source of the transistor MN1 flows with precision.

The output voltage of the first operational amplifier A1 is supplied to the gates of the transistors MP1 and MP2. The transistor MP1 is comprised of a P-channel MOS transistor of low withstand voltage and provided in series to the transistor MN3. The transistor MP2 is comprised of a P-channel MOS transistor of low withstand voltage and provided on a current path between the power supply voltage terminal Tvdd and the output terminal Tout as a third terminal, which is different from the current path of the transistor MP1. Therefore, current proportional to the current flowing in the transistor MP1 flows in the transistor MP2. That is, the transistors MP1 and MP2 form a current mirror circuit. The current mirror ratio is 1/M.

As described above, the voltage supply circuit OVL supplying voltage higher than the grounding voltage (GND) to the non-inversion input terminal Tni which is coupled to the grounding voltage terminal Tgnd as one of the two input terminals of the first operational amplifier A1 is further provided. The voltage supply circuit OVL has the transistor (first shift transistor) MN4 and the first current source CS1.

The transistor MN4 is comprised of, for example, an N-channel MOS transistor of high withstand voltage of the same size as that of the transistor MN3. The transistor MN4 is provided between the non-inversion input terminal Tni of the first operational amplifier A1 and the grounding voltage terminal Tgnd and, since the power supply voltage (VDD) is supplied to the gate, is always in an on state. That is, the transistor MN4 functions as a resistive element.

The first current source CS1 is provided between the power supply voltage terminal Tvdd and the non-inversion input terminal Tni of the first operational amplifier A1 and supplies current (Ish1) to the non-inversion input terminal Tni of the first operational amplifier A1. Consequently, voltage higher than the grounding voltage (GND) is supplied to the non-inversion input terminal Tni of the first operational amplifier A1.

By the influence of the offset voltage of the first operational amplifier A1, there is originally a case that the source voltage of the transistor MN3 should become lower than the drain voltage. However, if the voltage supply circuit OVL is not provided, the voltage of the inversion input terminal Tinv of the first operational amplifier A1 cannot become a negative voltage lower than the grounding voltage (GND) which is supplied to the non-inversion input terminal Tni, so that the source voltage of the transistor MN3 does not become lower than expected. As a result, the current detection in which the influence of an offset voltage is considered cannot be performed.

On the other hand, the current detection circuit 12L supplies the voltage higher than the grounding voltage (GND) to the non-inversion input terminal Tni of the first operational amplifier A1 by using the voltage supply circuit OVL. By the operation, the current detection circuit 12L can make the source voltage of the transistor MN3 lower than the drain voltage as expected in accordance with the influence of the offset voltage, so that current detection in which the offset voltage is considered can be performed.

As described above, the transistor MN3 detects 1/N (for example, N=1000) of the current flowing in the transistor MN1. The detected sense current (Isns) is sent back by the transistors MP1 and MP2 and output as the detection current (Isig).

The first current source CS1 and the second current source CS2 have the role of intentionally adding an offset to the detection current. Since the voltage at a virtual ground point of the first operational amplifier A1 rises when the current (Ish1) of the first current source CS1 is passed to the transistor MN4, the current flowing in the transistor MN3 increases, and a positive offset is applied. The voltage of the external output terminal Tlo at this time is negative.

When a positive offset is applied by the current (Ish1) of the first current source CS1, even when the solenoid current (Isln) does not flow (Isln=0 A), the virtual ground of the first operational amplifier A1 becomes positive voltage, so that the current can be detected correctly.

Since the current (Ish2) of the second current source CS2 is subtracted from the detection current (Isig), a negative offset is applied. When Ish1 becomes 0 A in accordance with increase of the solenoid current (Isln), no offset is applied and an error occurs. However, by applying a negative offset by the current (Ish2) of the second current source CS2, the error can be cancelled.

As illustrated in FIG. 9, the current amount (Ish1) of the first current source CS1 and the current amount (Ish2) of the second current source CS2 change according to the solenoid current (Isln). When the solenoid current (Isln) is smaller than a predetermined value, the current amount (Ish1) of the first current source CS1 passes current from the power supply voltage terminal Tvdd to the non-inversion input terminal Tinv. When the solenoid current (Isln) is equal to or larger than the predetermined value, the first current source CS1 does not pass current. When the solenoid current (Isln) is smaller than the predetermined value, the second current source CS2 passes current from the output terminal Tout to the grounding voltage terminal Tgnd. When the solenoid current (Isln) is equal to or larger than the predetermined value, no current is passed from the second current source CS2. In other words, when the solenoid current (Isln) is smaller than the predetermined value, the current amount (Ish1) of the first current source CS1 is larger than the current amount (Ish2) of the second current source CS2. When the solenoid current (Isln) is equal to or larger than the predetermined value, the current amount (Ish2) of the second current source CS2 is larger than the current amount (Ish1) of the first current source CS1.

The current source control circuit CSC is a circuit which detects the solenoid current (Isln) in a simple manner, and controls the current (Ish1) of the first current source CS1 and the current (Ish2) of the second current source CS2 on the basis of the detected current. Specifically, when the solenoid current (Isln) is smaller than a predetermined value, the current source control circuit CSC controls so that the current amount (Ish1) of the first current source CS1 decreases as the solenoid current (Isln) increases. The current source control circuit CSC controls not to pass current to the first current source CS1 when the solenoid current (Isln) is equal to or larger than a predetermined value, controls not to pass current to the second current source CS2 when the solenoid current (Isln) is smaller than the predetermined value, and controls so that the current of the second current source CS2 increases as the solenoid current (Isln) increase when the solenoid current (Isln) is equal to or larger than the predetermined value. The current detection precision of the current source control circuit CSC is lower than that of the current detection circuit 12L.

Since the gain of the first operational amplifier A1 changes as an intentional offset applied by the first current (Ish1) of the first current source CS1 and the current (Ish2) of the second current source CS2 fluctuates, it is designed so that a desired gain is obtained by adjusting the current mirror ratio of the transistors MP1 and MP2.

Next, an example of the current (Ish1) of the first current source CS1, the current (Ish2) of the second current source CS2, and the current mirror ratio of the transistors MP1 and MP2 will be described.

To obtain desired input/output characteristics in the current detection circuit 12L, it is necessary to properly design the current (Ish1) of the first current source CS1, the current (Ish2) of the second current source CS2, and the current mirror ratio of the transistors MP1 and MP2. The above-described currents satisfy the relations of equations (1) to (4).

$$Isns=(1/N)Isln+Ish1 \quad (1)$$

$$Ish1=K \cdot \max(Ish-\alpha GIsln,0) \quad (2)$$

$$Ish2=\max(\alpha Isln-Ish,0) \quad (3)$$

$$Isig=(Isns/M)-Ish2 \quad (4)$$

Isns denotes current flowing in the transistor MN3, a and K denote proper constants, M denotes the current mirror ratio of the transistors MP1 and MP2, N denotes sense ratio of the transistor MN2 as the low-side driver and the transistor MN3 as the sense transistor, and Ish is the value of an intentional offset and a current value (Isig) which is output from the current detection circuit when the solenoid current (Isln) is 0 A.

By the above equations (1) to (4), the following design values are derived.

$$Isig=(1/MoN)Isln+Ish \quad (5)$$

$$K=Mo \quad (6)$$

$$M=Mo/(1+\alpha MoN) \quad (7)$$

$$\alpha=Ish/Isln0 \quad (8)$$

Mo denotes current gain of the sense amplifier, and Isln0 denotes solenoid current which makes Ish=αIsln.

Figure 10:
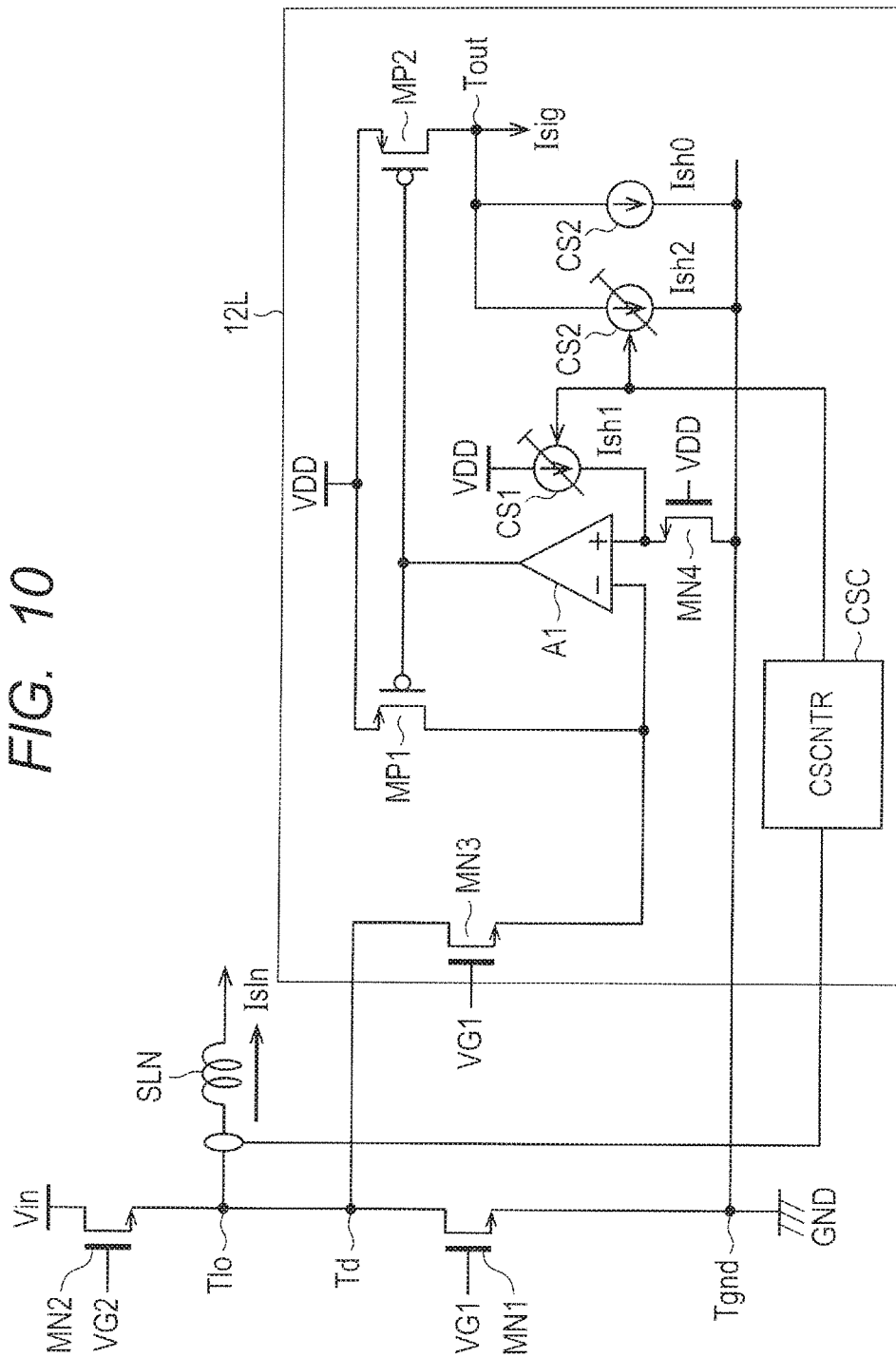
FIG. 10 is a circuit diagram of a current detection circuit of eliminating an intentional offset.

The intentional offset applied by the current detection circuit 12L has to be eliminated in a later stage. A method of eliminating the intentional offset will be described with reference to FIG. 10. FIG. 10 is a circuit diagram of the current detection circuit of the low-side driver including a circuit of eliminating an intentional offset.

As illustrated in FIG. 10, the current detection circuit 12L is a circuit obtained by adding a constant current source CC0 in parallel to the second current source CS2 of the current detection circuit 12L in FIG. 9. In other words, the constant current source CC0 is provided between the output terminal Tout and the grounding voltage terminal Tgnd. By subtracting the current (Ish0) in an analog manner, an intentional offset can be eliminated from the detection current (Isig). In this case, the current (Ish0) is the current (Ish1) when Isln=0 A.

Figure 11:
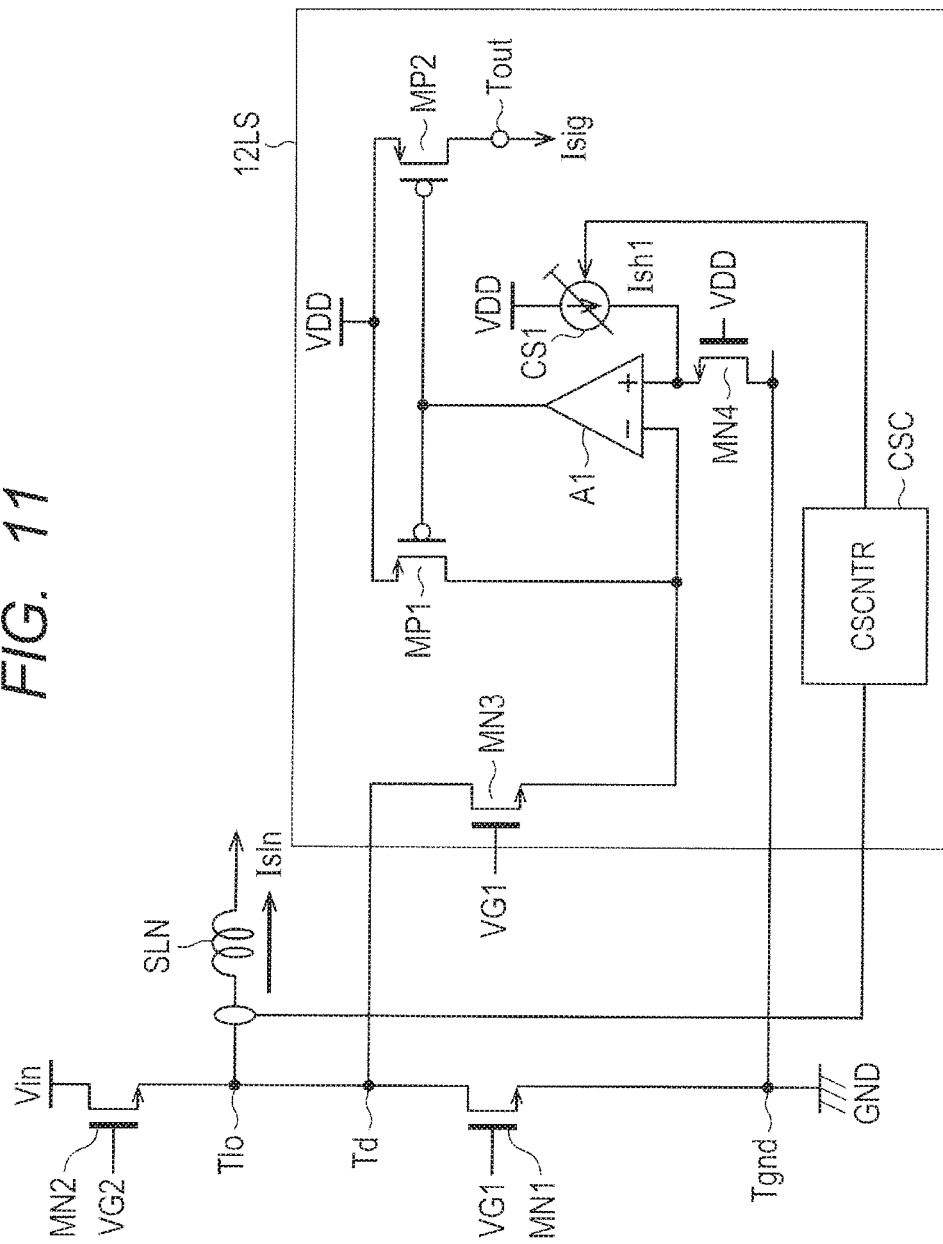
FIG. 11 is a circuit diagram illustrating a current detection circuit of a low-side driver of a second comparative example.
Figure 12:
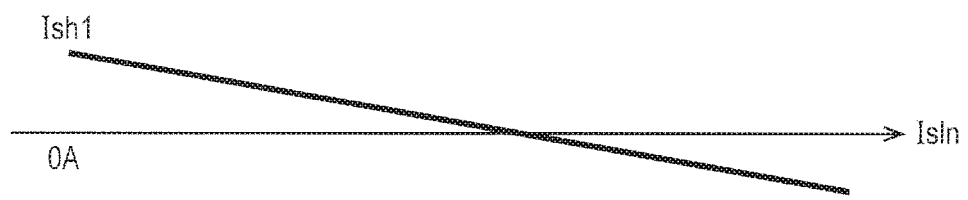
FIG. 12 is a diagram illustrating current of a first current source of the current detection circuit in FIG. 11.
Figure 13A:
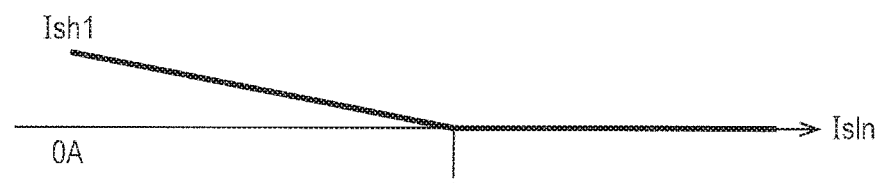
FIGS. 13A and 13B are diagrams illustrating characteristics of a first current source in the case where a negative current source is not used.
Figure 13B:
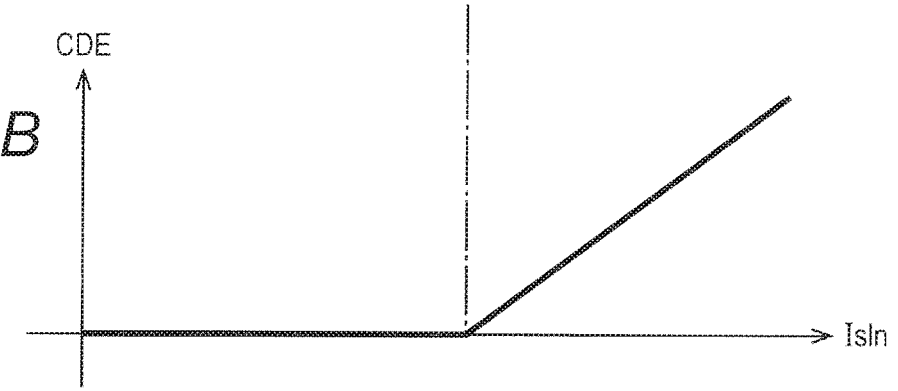

Next, the reason of using two current sources of the first and second current sources CS1 and CS2 will be described by using a current detection circuit of a second comparative example. FIG. 11 is a circuit diagram illustrating a current detection circuit of a second comparative example. FIG. 12 is a diagram illustrating current of a first current source of the current detection circuit in FIG. 11. FIGS. 13A and 13B are diagrams illustrating characteristics of the first current source in the case where a negative current source is not used. FIG. 13A is a diagram illustrating the current of the first current source, and FIG. 13B is a diagram illustrating a current detection error.

A current detection circuit 12LS of the second comparative example in FIG. 11 is obtained by eliminating the second current source CS2 from the current detection circuit 12L of the example of FIG. 8. When the current detection circuit 12LS is comprised only of the first current source CS1, as illustrated in FIG. 12, the current (Ish1) flowing in the first current source CS1 becomes negative in some midpoint. To realize it, the current has to be drawn from the ground voltage terminal Tgnd so that a negative power supply is necessary. To realize both positive and negative currents by using circuits, two current mirrors have to be prepared to handle both of the signs. Therefore, two current sources are actually provided.

In the case where no negative power supply is used, as illustrated in FIG. 13A, the current (Ish1) of the first current source CS1 becomes zero in some midpoint. In this case, an intentional offset becomes zero when the solenoid current (Isln) is large and the detection current value is folded. Consequently, as illustrated in FIG. 13B, a current detection error (CDE) occurs.

According to the example, also in the case where there is an offset in the first operational amplifier A1, current around Isln=0 A can be detected. When the current (Ish1) of the first current source CS1 is constant (the first comparative example of FIG. 2), a non-linear error occurs where the solenoid current (Isln) is large. However, in the embodiment, since Ish1=0 A where the solenoid current (Isln) is large, a non-linear error does not occur. In the case of using a detection resistor as in the patent literature 1, large current has to be passed to the detection resistor and a low resistance value has to be realized with high precision. Consequently, the area of the detection resistor becomes large. For example, the detection resistor becomes the size almost the same as that of a drive transistor. Since no detection resistor is used in the embodiment, a plurality of semiconductor devices 10 can be also formed in a single semiconductor chip.

Modifications

Hereinafter, some representative modifications will be described. In the following description of the modifications, a sign similar to that in the above-described embodiments can be used for a part having a configuration and a function similar to those described in the embodiments. For the part, the description in the above-described embodiments can be properly used as long as it is technically consistent. A part of the embodiments and all or part of the plurality of modifications can be properly applied in a composite manner as long as they are technically consistent.

First Modification

Figure 14:
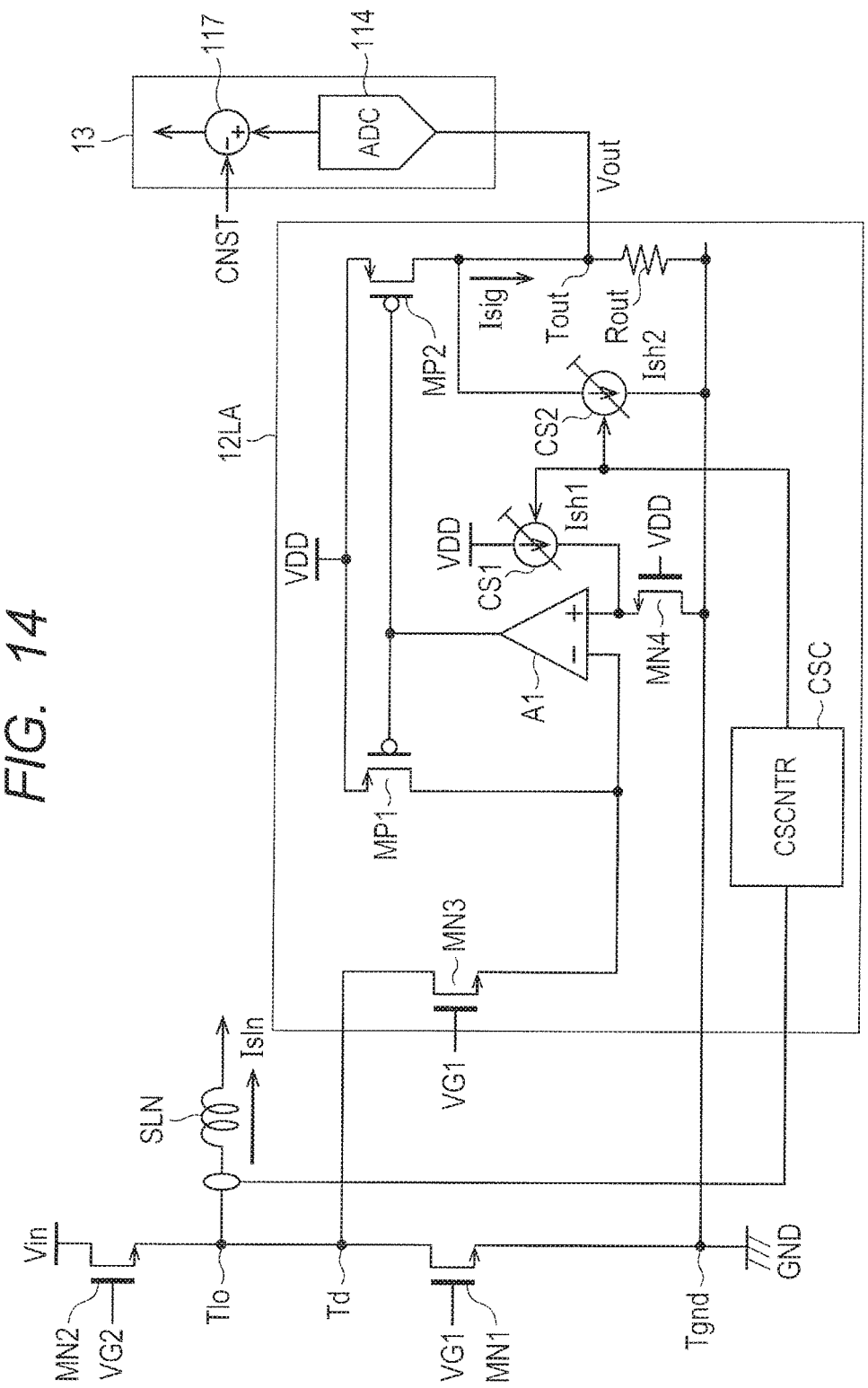
FIG. 14 is a circuit diagram illustrating a current detection circuit of a low-side driver of a first modification.

Although an intentional offset is eliminated in an analog manner in the example, another example (first modification) will be described with reference to FIG. 14. FIG. 14 is a circuit diagram illustrating a current detection circuit of a low-side driver of the first modification. FIG. 14 also illustrates the analog/digital converter (AD converter) 114 as a part of the components provided for the control unit 13.

Since the detection current is AD converted and a current detection value is used as a digital value as illustrated in FIG. 7, an intentional offset may be eliminated by a method of subtracting it from the digital value obtained after the AD conversion.

As illustrated in FIG. 14, the current detection circuit 12LA has a resistor Rout between the transistor MP1 (the output terminal Tout) of the current detection circuit 12L in FIG. 8 and the grounding voltage terminal Tgnd. The current detection circuit 12LA converts the detection current (Isig) which is output, to the voltage (Vout) by the resistor Rout. The control unit 13 of the first modification has an addition circuit 117 between the AD converter 114 and the filter 115. The AD converter 114 converts the voltage (Vout) to a digital value and the addition circuit 117 subtracts the constant (CNST) corresponding to the intentional offset from the digital value, thereby obtaining a current detection value.

Second Modification

Figure 15:
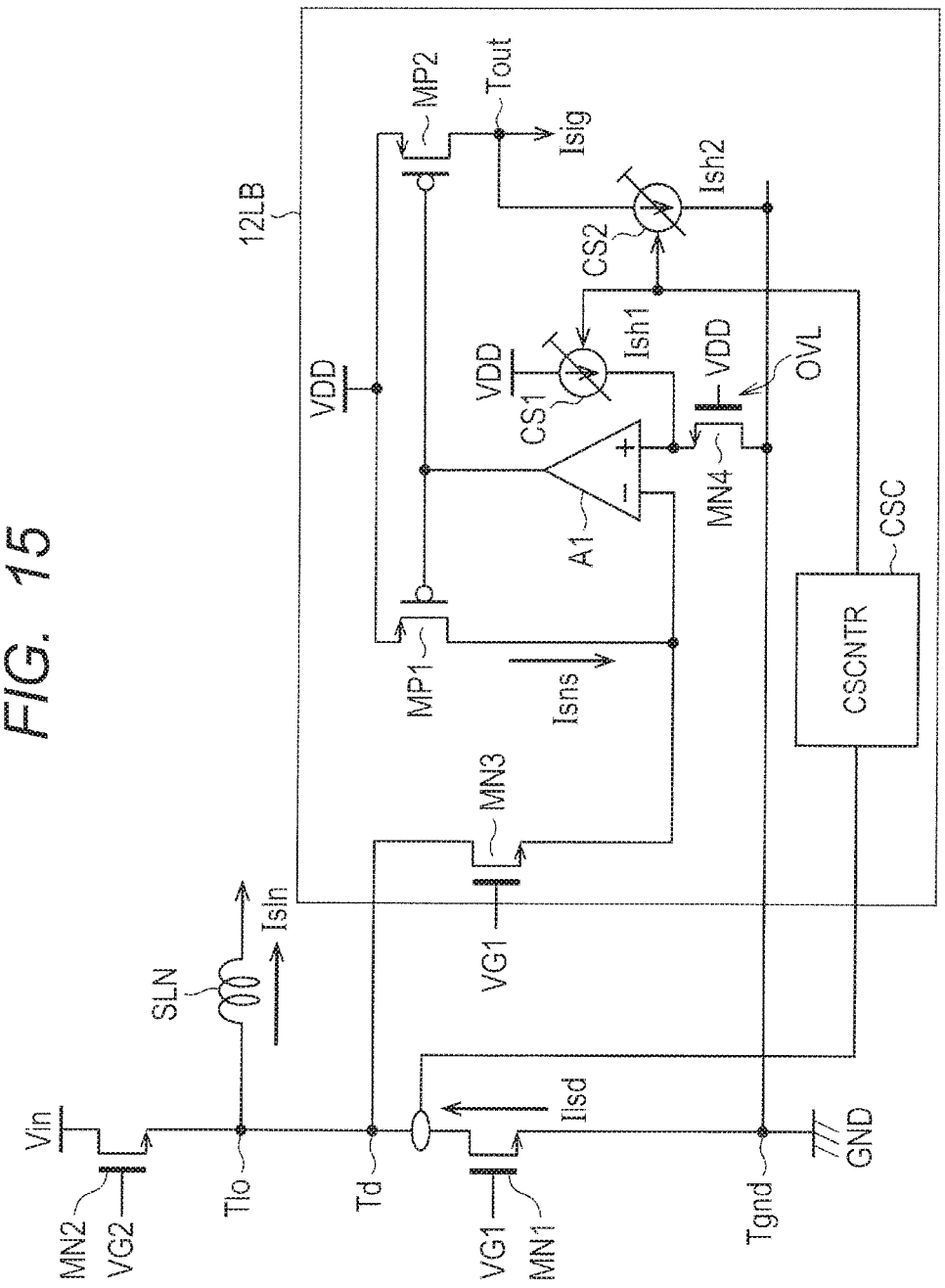
FIG. 15 is a circuit diagram illustrating a current detection circuit of a low-side driver of a second modification.

An example (second modification) in which an object to be detected by the current source control circuit CSC will be described with reference to FIG. 15. FIG. 15 is a circuit diagram illustrating a current detection circuit of a low-side driver of a second modification.

In the example, the current (detection target) detected by the current source control circuit CSC is the solenoid current (Isl1). The detection target of the current source control circuit CSC of the current detection circuit 12LB of the second modification is the current (Ilsd) of the transistor MN1 as a low-side driver.

With respect to the case of detecting the current (Ilsd) of the transistor MN1, since the current (Ilsd) of the transistor MN1 is almost equal to the solenoid current (Isln), the current (Ish1) of the first current source CS1, the current (Ish2) of the second current source CS2, and the current mirror ratio between the transistors MP1 and MP2 can be obtained from the equations (1) to (8) in a manner similar to the example.

Third Modification

Figure 16:
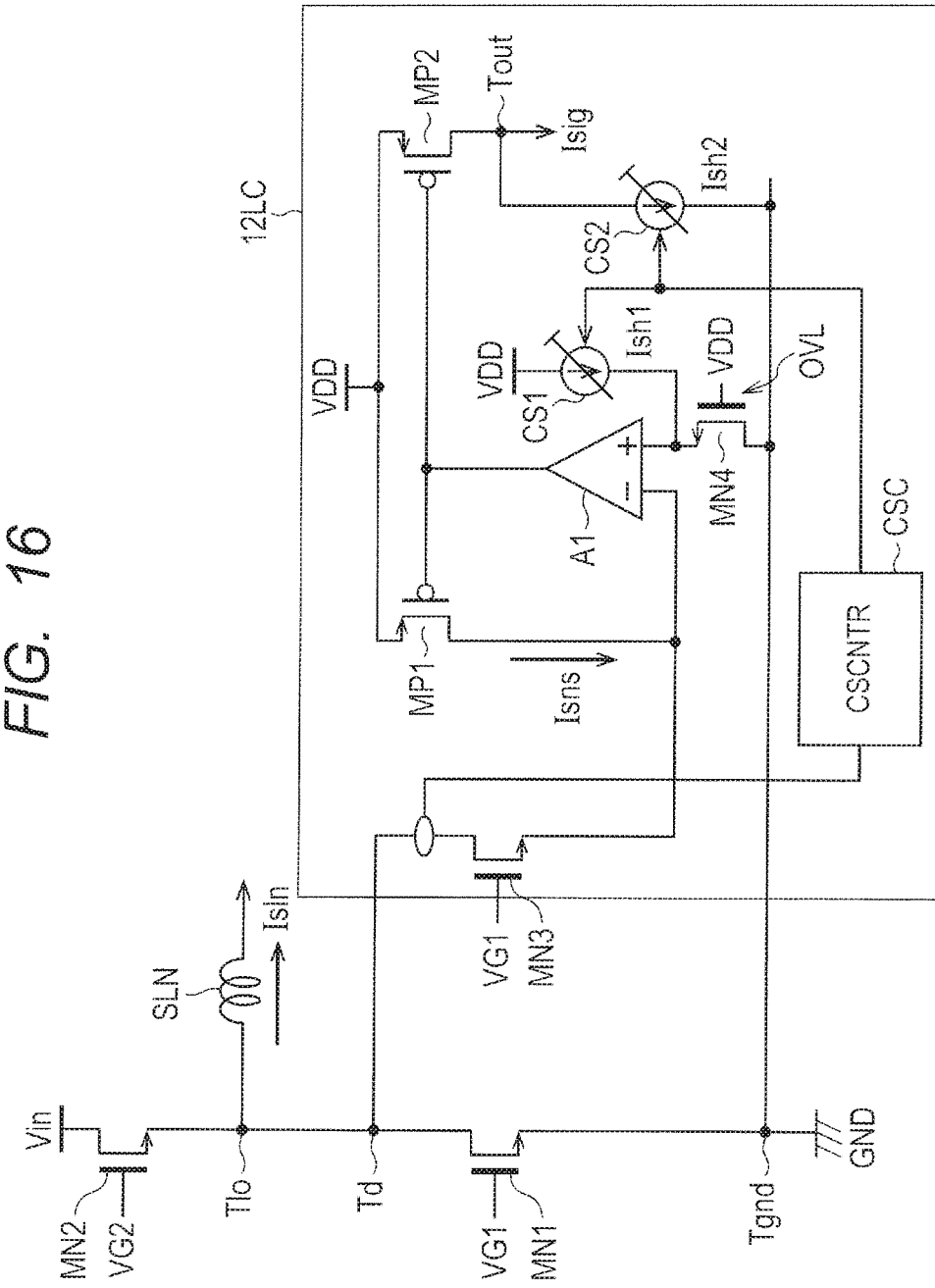
FIG. 16 is a circuit diagram illustrating a current detection circuit of a low-side driver of a third modification.

An example (third modification) in which an object to be detected by the current source control circuit CSC will be described with reference to FIG. 16. FIG. 16 is a circuit diagram illustrating a current detection circuit of a low-side driver of a third modification.

In the example, the current (detection target) detected by the current source control circuit CSC is the solenoid current (Isln). The detection target of the current source control circuit CSC of the current detection circuit 12LC of the third modification is the current (Isns) of the sense transistor.

The current (Ish1) of the first current source CS1, the current (Ish2) of the second current source CS2, and the current mirror ratio between the transistors MP1 and MP2 in the current detection circuit 12LC are different from those of the embodiment. The above-described currents have the relations (11) to (14).

$$Isns=(I/N)Isln+Ish1 \quad (11)$$

$$Ish1=K\cdot\max(Ish-\beta Isns,0) \quad (12)$$

$$Ish2=\max(\beta Isns-Ish,0) \quad (13)$$

$$Isig=(Isns/M)-Ish2 \quad (14)$$

β and K denote proper constants, M denotes the current mirror ratio of the transistors MP1 and MP2, N denotes sense ratio of the transistor MN2 as the low-side driver and the transistor MN3, and Ish is the value of an intentional offset and the current value (Isig) which is output from the current detection circuit when the solenoid current (Isln) is 0 A.

By the above equations (11) to (14), the following design values are derived.

$$Isig=(1/MoN)IL+Ish \quad (15)$$

$$K=Mo \quad (16)$$

$$M=(1-\beta)Mo \quad (17)$$

$$\beta=NIsh/Isln \quad (18)$$

Mo denotes current gain of the sense amplifier, and Isln denotes solenoid current which makes Ish=βIsns.

Fourth Modification

Figure 17:
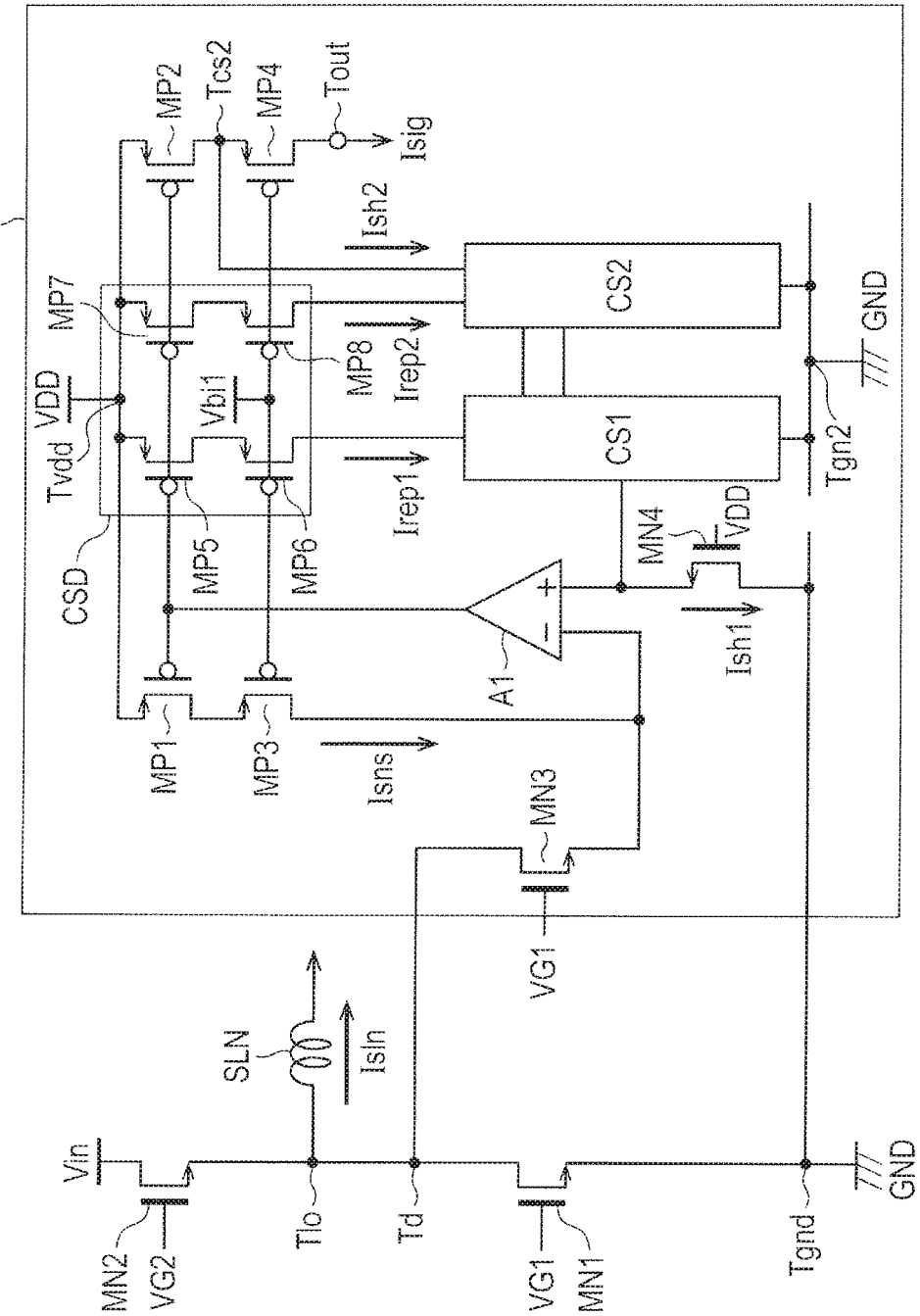
FIG. 17 is a circuit diagram illustrating a current detection circuit of a low-side driver of a fourth modification.
Figure 18:
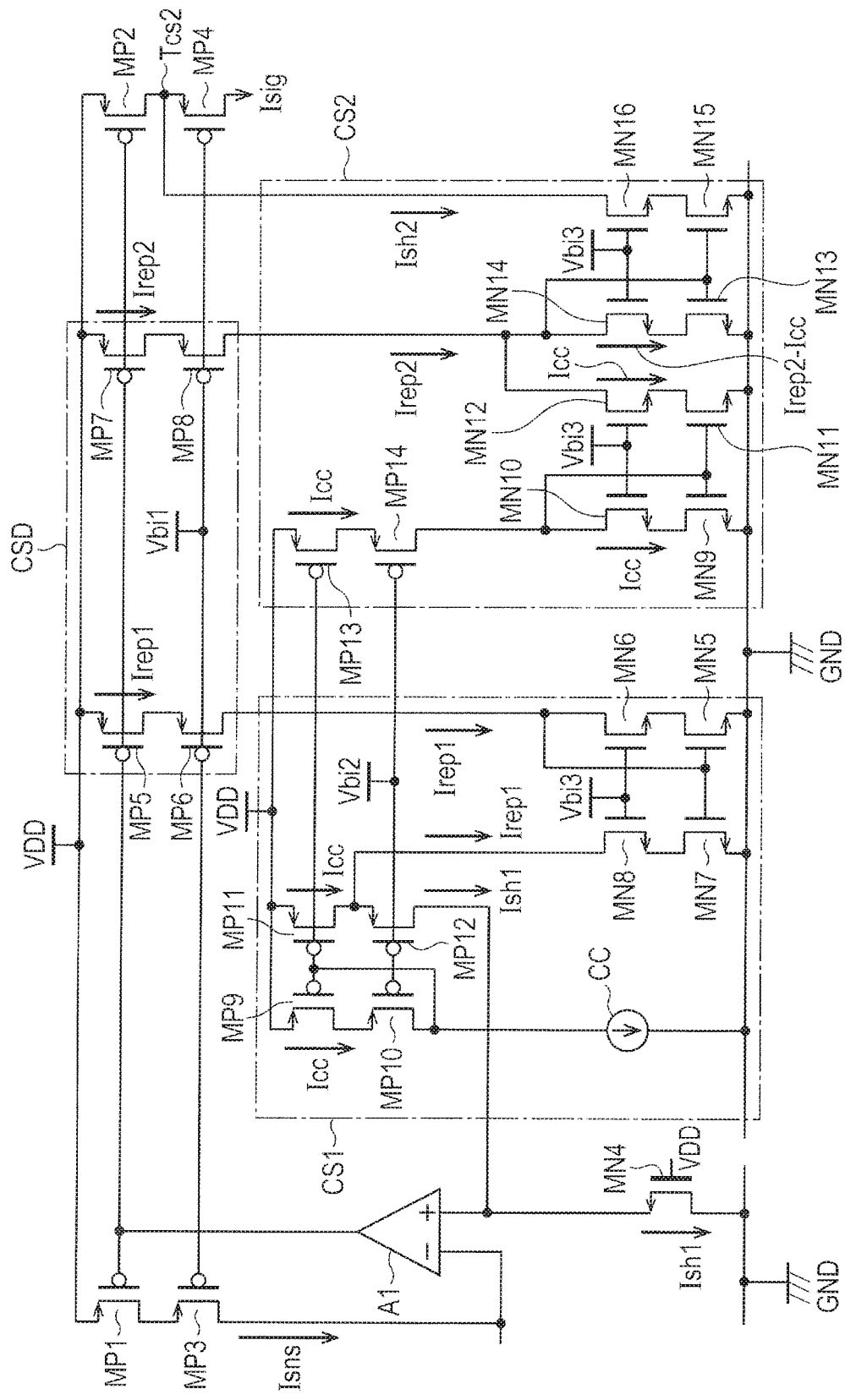
FIG. 18 is a circuit diagram illustrating first and second current sources of the current detection circuit of the low-side driver of FIG. 17.
Figure 19A:
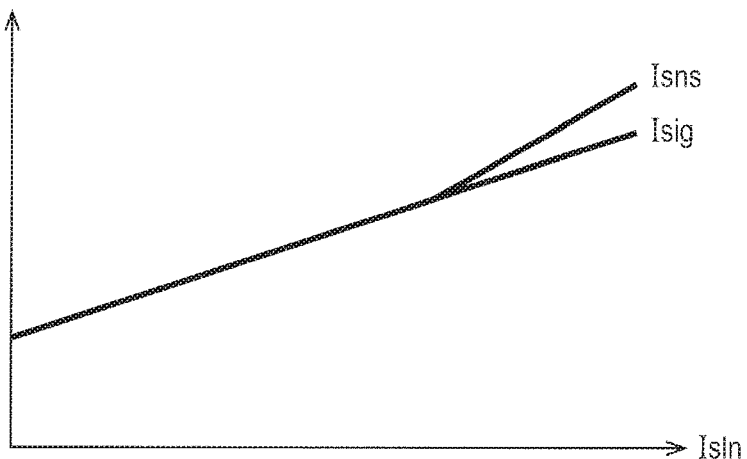
FIGS. 19A to 19C are diagrams illustrating solenoid current dependency of currents flowing in current paths in the current detection circuit of the low-side driver of FIG. 17.
Figure 19B:
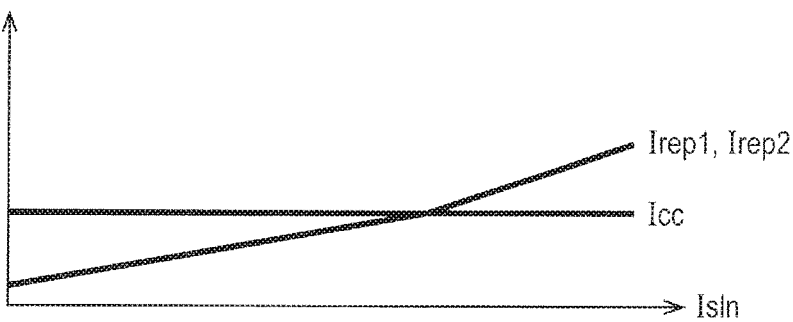
Figure 19C:
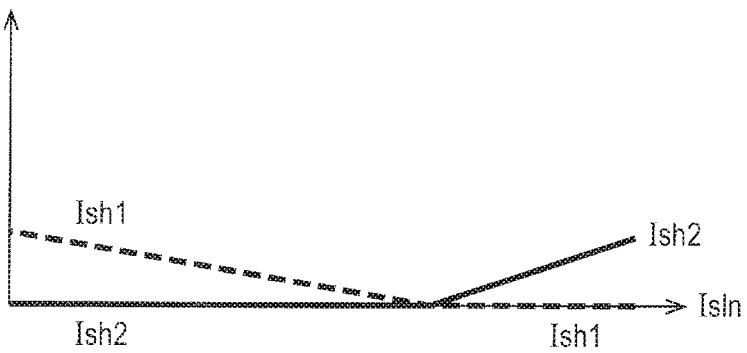

An example (fourth modification) of realizing concrete circuits by using MOS transistors as the first and second current sources CS1 and CS2 of the example will be described with reference to FIG. 17 to FIGS. 19A to 19C. FIG. 17 is a circuit diagram illustrating a current detection circuit of a low-side driver of the fourth modification. FIG. 18 is a circuit diagram illustrating first and second current sources of the current detection circuit of the low-side driver of FIG. 17. FIGS. 19A to 19C are diagrams illustrating solenoid current dependency of currents flowing in current paths in the current detection circuit of the low-side driver of FIG. 17. FIG. 19A is a diagram illustrating sense current and detection current, FIG. 19B is a diagram illustrating first replica current, second replica current, and current of a constant current source, and FIG. 19C is a diagram illustrating the current of the first current source and the current of the second current source.

In the current detection circuit 12LD of the low-side driver of the fourth modification, the current source control circuit CSD does not directly detect the solenoid current (Isln) but detects the sense current (Isns) as a copy of the solenoid current (Isln) as in the third modification. Concretely, the sense current (Isns) is copied and a copy is taken as a first replica current (Irep1) and a second replica current (Irep2). The current (Ish1) of the first current source CS1 and the current (Irep2) of the second current source CS2 are generated by adding/subtracting the first replica current (Irep1), the second replica current (Irep2), and the current (Icc) of the constant current source CC by the current mirror. Hereinafter, the details will be described.

The transistors MP1 and MP3 are comprised of P-channel MOS transistors of low withstand voltage and provided in series to the transistor MN3. The transistors MP2 and MP4 are comprised of P-channel MOS transistors of low withstand voltage and provided in series on the current path between the power supply voltage terminal Tvdd and the output terminal Tout as another current path in the transistors MP1 and MP3. To the gate of each of the transistors MP3 and MP4, first bias voltage (Vbi1) is supplied. Further, the gate of the transistor MP2 is coupled to the gate of the transistor MP1 and the output of the first operational amplifier A1. Therefore, in the transistors MP2 and MP4, current (Isig) proportional to the current (Isns) flowing in the transistors MP1 and MP3 flows. That is, the transistors MP1 to MP4 configure a current mirror circuit. The current mirror ratio is 1/M.

The current source control circuit CSD has transistors MP5 to MP8. The transistors MP5 and MP6 are comprised of P-channel MOS transistors of low withstand voltage, and provided in series on the current path between the power supply voltage terminal Tvdd and the first current source CS1, which is different from the current path of the transistors MP1 and MP3. To the gate of the transistor MP6, the first bias voltage (Vbi1) is supplied. Further, the gate of the transistor MP5 is coupled to the gate of the transistor MP1 and the output of the first operational amplifier A1. Therefore, in the transistors MP5 and MP6, the first replica current (Irep1) proportional to the current (Isns) flowing in the transistors MP1 and MP3 flows. That is, the transistors MP1, MP3, MP5, and MP6 configure a current mirror circuit. The current mirror ratio is 1/ML.

The transistors MP7 and MP8 are comprised of P-channel MOS transistors of low withstand voltage and provided in series on the current path between the power supply voltage terminal Tvdd and the second current source CS2 as another current path in the transistors MP1 and MP3. To the gate of the transistor MP8, the first bias voltage (Vbi1) is supplied. Further, the gate of the transistor MP7 is coupled to the gate of the transistor MP1 and the output of the first operational amplifier A1. Therefore, in the transistors MP7 and MP8, the second replica current (Irep2) proportional to the current (Isense) flowing in the transistors MP1 and MP3 flows. That is, the transistors MP1, MP3, MP7, and MP8 configure a current mirror circuit. The current mirror ratio is 1/ML.

As illustrated in FIG. 18, the first current source CS1 has transistors MP9 to MP12 and MN5 to MN8 and the constant current source CC. The transistors MP9 and MP10 are comprised of P-channel MOS transistors of low withstand voltage and provided in series to the constant current source CC. One end of the constant current source CC is coupled to the second grounding voltage terminal Tgn2. The transistors MP11 and MP12 are comprised of P-channel MOS transistors of low withstand voltage and provided in series on the current path between the power supply voltage terminal Tvdd and the output (the non-inversion input terminal Tni of the first operational amplifier A1) of the first current source CS1 as another current path in the transistors MP9 and MP10. To the gate of each of the transistors MP10 and MP12, the second bias voltage (Vbi2) is supplied. Further, the gate of the transistor MP11 is coupled to the gate of the transistor MP9 and the drain of the transistor MP10. Therefore, in the transistor MP11, current proportional to the current (Icc) of the constant current source CC flowing in the transistors MP9 and MP10 flows. That is, the transistors MP9 to MP12 configure a current mirror circuit. The current mirror ratio is one time, and the current (Icc) equivalent to the current amount of the constant current source CC flows in the transistor MP11.

The transistors MN5 and MN6 are comprised of N-channel MOS transistors of low withstand voltage and provided in series to the transistor MP6. The transistors MN7 and MN8 are comprised of N-channel MOS transistors of low withstand voltage and provided in series on a current path between the second grounding voltage terminal Tgn2 and the drain of the transistor MP11 as another current path of the transistors MN5 and MN6. To the gate of each of the transistors MN6 and MN8, the third bias voltage (Vbi3) is supplied. Further, the gate of the transistor MN5 is coupled to the gate of the transistor MN7 and the drain of the transistor MN6. Therefore, in the transistors MN7 and MN8, current proportional to the first replica current (Irep1) flowing in the transistors MN5 and MN6 flows. That is, the transistors MN5 to MN8 configure a current mirror circuit. The current mirror ratio is one, and the current (Ish1) of the first current source CS1 becomes current (Ish1=Icc−Irep1) obtained by subtracting the first replica current (Irep1) from the current (Icc) of the constant current source CC.

The second current source CS2 has transistors MP13, MP14, and MN9 to MN16. The transistors MP13 and MP14 are comprised of P-channel MOS transistors of low withstand voltage and provided in series to the transistor MN10. To the gate of the transistor MP14, the second bias voltage (Vbi2) is supplied. Further, the gate of the transistor MP13 is coupled to the gate of the transistor MP9 and the drain of the transistor MP10. Therefore, in the transistors MP13 and MP14, current proportional to the current (Icc) flowing in the transistors MP9 and MP10 flows. That is, the transistors MP9, MP10, MP13, and MP14 configure a current mirror circuit. The current mirror ratio is one, and the current (Icc) equivalent to the current amount of the constant current source CC flows in the transistor MP13.

The transistors MN9 and MN10 are comprised of N-channel MOS transistors of low withstand voltage and provided in series to the transistor MP14. The transistors MN11 and MN12 are comprised of N-channel MOS transistors of low withstand voltage and provided in series on a current path between the second grounding voltage terminal Tgn2 and the transistor MP8 as another current path of the transistors MN9 and MN10. To the gate of each of the transistors MN10 and MN12, the third bias voltage (Vbi3) is supplied. Further, the gate of the transistor MN11 is coupled to the gate of the transistor MN9 and the drain of the transistor MN10. Therefore, in the transistors MN11 and MN12, current proportional to the current (Icc) flowing in the transistors MN9 and MN10 flows. That is, the transistors MN9 to MN12 configure a current mirror circuit. The current mirror ratio is one, and the current (Icc) equivalent to the current amount of the constant current source CC flows in the transistor MN10.

The transistors MN13 and MN14 are comprised of N-channel MOS transistors of low withstand voltage and provided in series to the transistor MP8. The transistors MN15 and MN16 are comprised of N-channel MOS transistors of low withstand voltage and provided in series on a current path between the second grounding voltage terminal Tgn2 and the terminal Tcs2 as the third terminal as another current path of the transistors MN13 and MN14. To the gate of each of the transistors MN14 and MN16, the third bias voltage (Vbi3) is supplied. Further, the gate of the transistor MN15 is coupled to the gate of the transistor MN13 and the drain of the transistor MN14. Therefore, in the transistors MN15 and MN16, current proportional to the current (Irep2−Icc) flowing in the transistors MN13 and MN14 flows. That is, the transistors MN13 to MN16 configure a current mirror circuit. The current mirror ratio is one, and the current of the second current source CS2 is current (Ish2=Irep2−Icc) obtained by subtracting the current (Icc) of the constant current source CC from the second replica current (Irep2).

As illustrated in FIG. 19, in the fourth modification, in the current mirror circuit, a replica of 1/ML of the sense current (Isns) is generated as the first replica current (Irep1) and the second replica current (Irep2) (FIG. 19B) and added/subtracted to/from the current (Icc) of the constant current source CC, thereby generating the current (Ish1) of the first current source CS1 and the current (Ish2) of the second current source CS2 which fluctuate according to the solenoid current (Isln) (FIG. 19C). Consequently, as illustrated in FIG. 19A, the detection current (Isig) has linearity. The detection current (Isig) has an offset.

To obtain desired input/output characteristics in the current detection circuit of the fourth modification, it is necessary to properly set the current (Ish1) of the first current source CS1, the current (Ish2) of the second current source CS2, and the current mirror ratio of the transistors MP1 and MP2. The above-described currents satisfy the relations of equations (21) to (25).

$$Isns = (1/N)Isln + Ish1 \quad (21)$$

$$Ish1 = K \cdot \max(Ish - \alpha Isln, 0) \quad (22)$$

$$Ish2 = \max(\alpha Isln - Ish, 0) \quad (23)$$

$$Isig = (Isns/M) - Ish2 \quad (24)$$

$$Irep = Irep1 = Irep2 \quad (25)$$
$$= (1/LM)Isns$$

α and K denote proper constants, M denotes the current mirror ratio of the transistors MP1 and MP2, N denotes sense ratio of the transistor MN2 as the low-side driver and the transistor MN3, and Ish is the value of an intentional offset and a current value (Isig) which is output from the current detection circuit when the solenoid current (Isln) is 0 A.

By the above equations (21) to (25), the following design values are derived.

$$Isig=(1/MoN)Isln+Ish \quad (26)$$

$$K=Mo \quad (27)$$

$$L=Isln0/(MoN \cdot Ish)+1 \quad (28)$$

$$M=Mo/(1+\alpha MoN) \quad (29)$$

Mo denotes current gain of the sense amplifier, and Isln0 denotes solenoid current which makes Ish=Irep.

In the fourth modification, the current source control circuit CSD and the current detection circuit of the main commonly use the sense transistor (transistor MN3), the first operational amplifier A1, and the transistors MP1 and MP2, so that the area and consumption current can be reduced.

Fifth Modification

Figure 20:
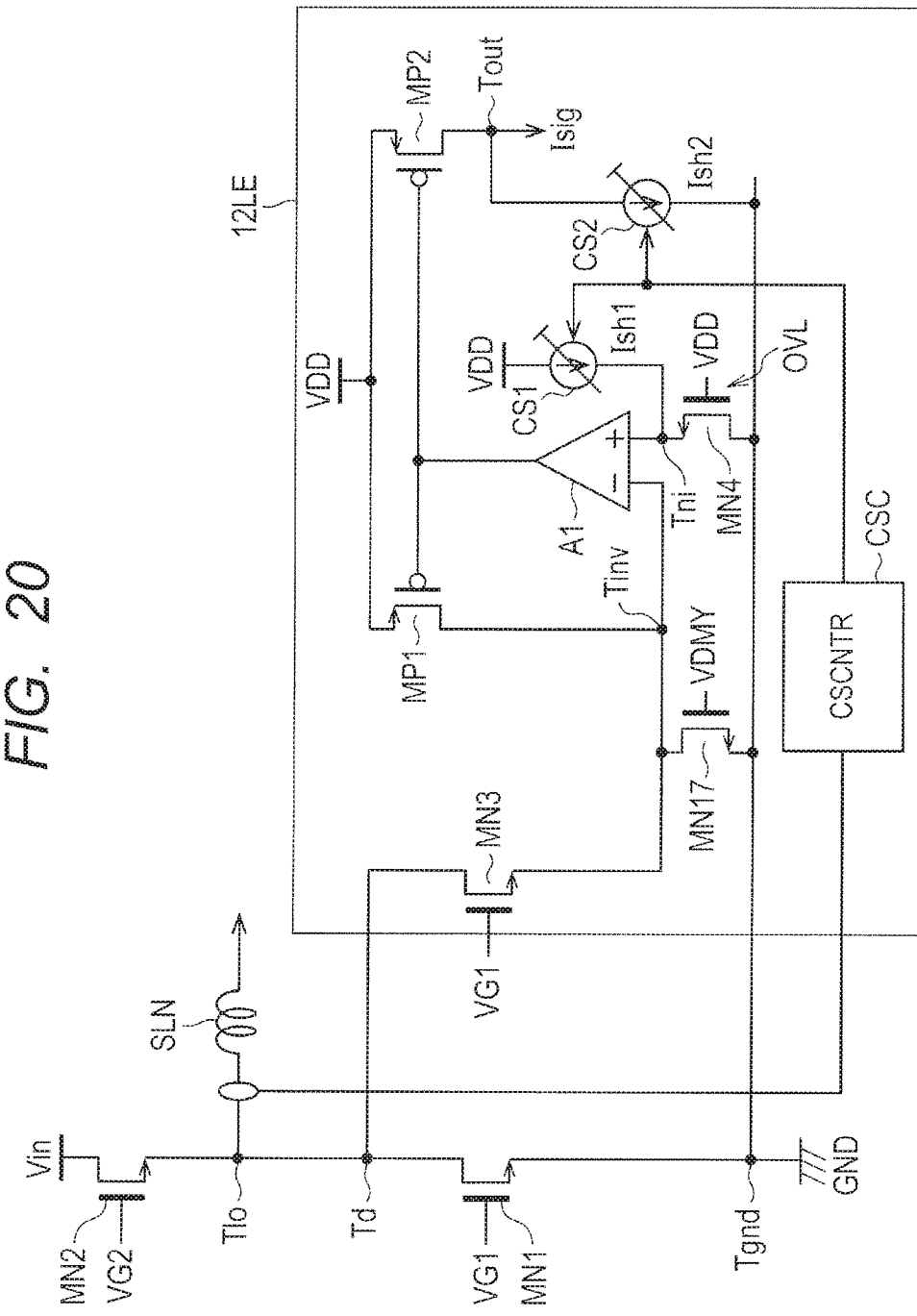
FIG. 20 is a circuit diagram illustrating a current detection circuit of a low-side driver of a fifth modification.
Figure 21:
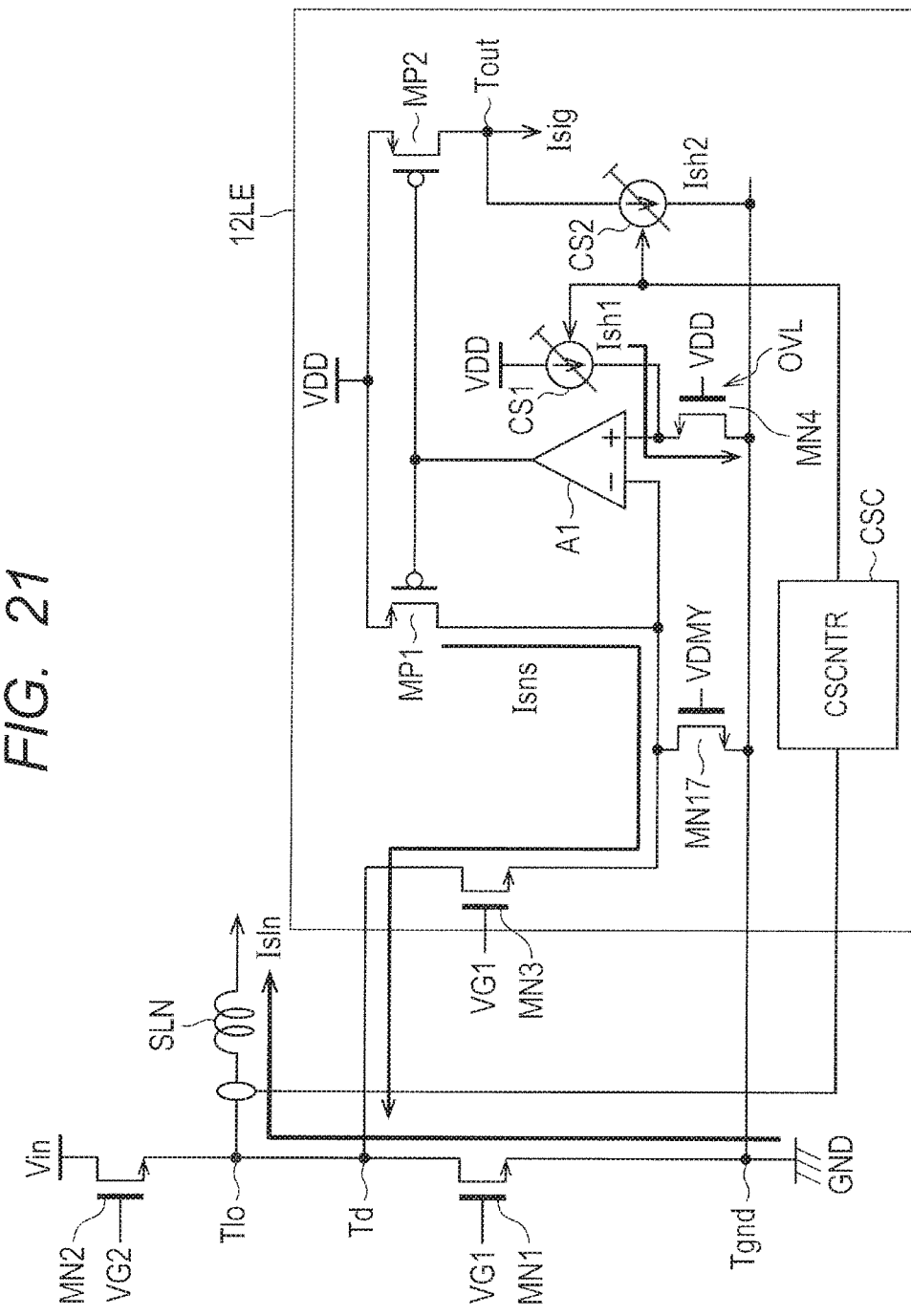
Figure 22:
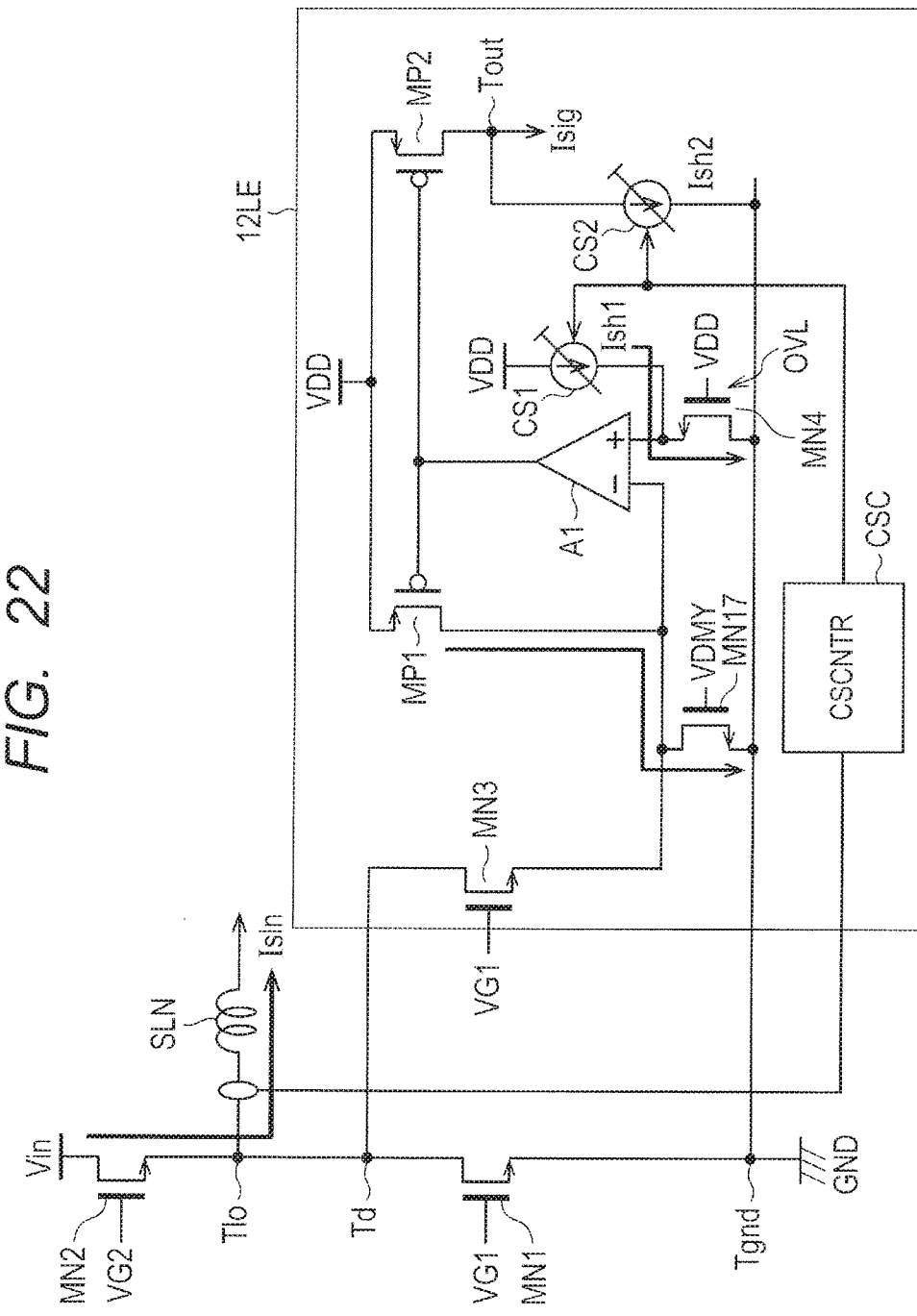

In the current detection circuit 12L of the example of FIG. 8, when the transistor MN2 as a high-side driver is on, the transistor MN3 is turned off. At this time, the load condition of the first operational amplifier A1 is different from that in the case where the transistor MN1 as a low-side driver is on. As a result, there is the possibility that response of the current detection circuit when the transistor MN1 is on becomes slow due to a transient response. The current detection circuit of the low-side driver of the fifth modification improving it will be described with reference to FIGS. 20 to 22. FIG. 20 is a circuit diagram illustrating a current detection circuit of a low-side driver of the fifth modification. FIG. 21 is a diagram illustrating current paths in the case where the low-side driver in the current detection circuit of the low-side driver of FIG. 20 is on. FIG. 22 is a diagram illustrating current paths in the case where a low-side driver in the current detection circuit of the high-side driver of FIG. 20 is on.

As illustrated in FIG. 20, a current detection circuit 12LE of the fifth modification further has a transistor (switch transistor) MN17 for passing current to the current detection circuit 12L of the example of FIG. 8 in the period that the transistors MN1 and MN3 are off.

The transistor MN17 is comprised of, for example, an N-channel MOS transistor of high withstand voltage of the same size as that of the transistor MN3. The transistor MN17 is provided between the inversion input terminal Tinv of the first operational amplifier A1 and the grounding voltage terminal Tgnd. The on/off of the transistor MN17 is controlled by a signal (VDMY) of the same phase as that of the pulse signal (VG2) as an inversion signal of the pulse signal (VG1). That is, the on/off of the transistor MN17 is controlled complementarily with respect to the transistors MN2 and MN3. The resistance value when the transistor MN17 is on indicates the same value as the resistance value when the transistor MN3 is on. Since the other configuration of the current detection circuit 12LE is similar to that of the current detection circuit 12L, the description will not be repeated.

When the transistor MN1 is on, as illustrated in FIG. 21, the transistor MN3 is also turned on and current flows in the transistor MN3. When the transistor MN2 is on, as illustrated in FIG. 22, the transistor MN17 is also turned on and current flows in the transistor MN17.

Consequently, even when the transistor MN3 is turned off, the transistor MN17 is turned on, so that the load by the resistive element for the first operational amplifier A1 is maintained constant. That is, the load condition of the first operational amplifier A1 when the transistor MN1 is on and that when the transistor MN2 is on can be made the same by the transistor MN17. As a result, setting time of the first operational amplifier A1 after the on/off of the transistor MN3 is switched can be reduced, so that high-speed operation can be realized.

Sixth Modification

Figure 23:
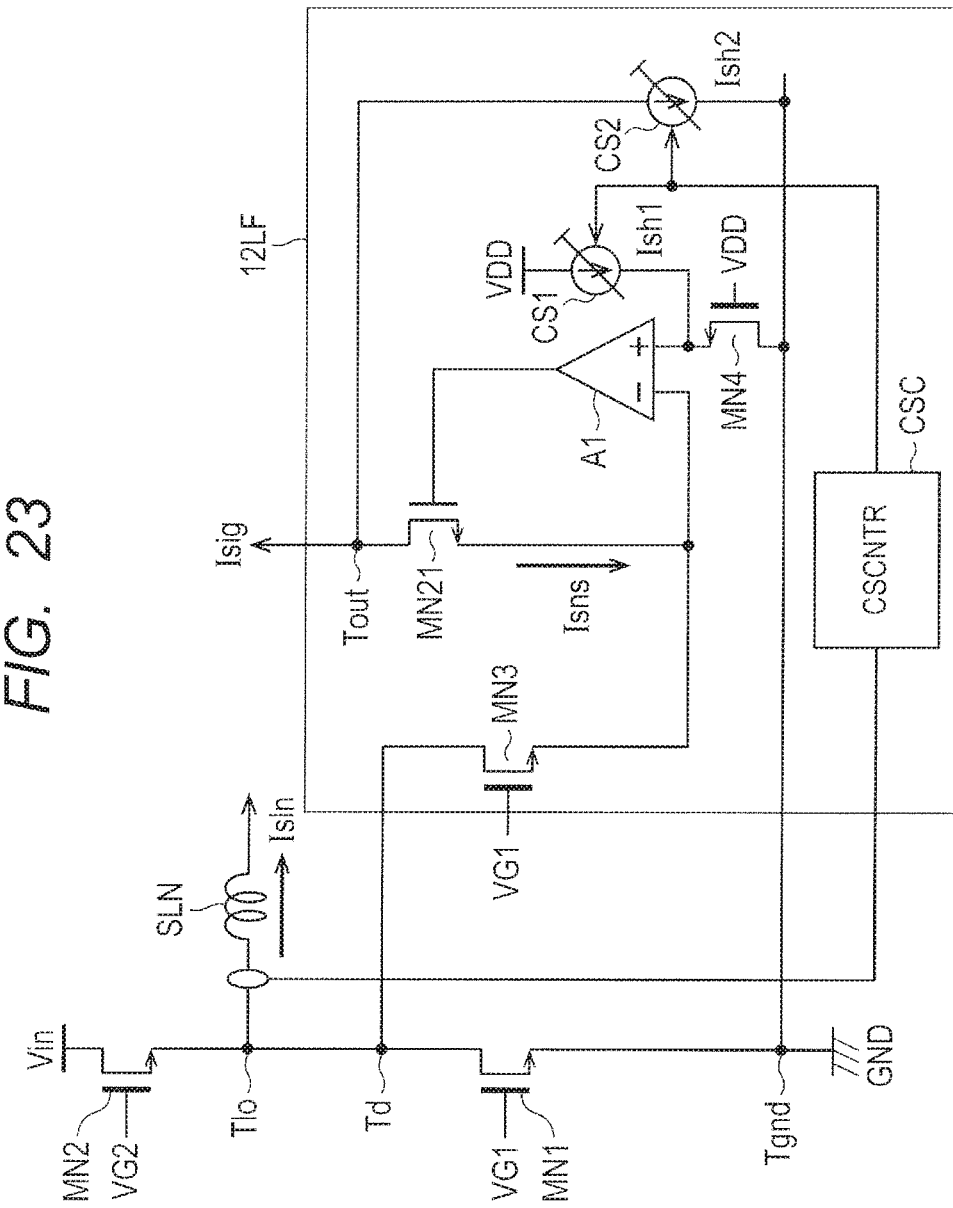
FIG. 23 is a circuit diagram illustrating a current detection circuit of a low-side driver of a sixth modification.

Although the current is folded back by the transistors MP1 and MP2 in the embodiment, detection current is a current source (PMOS output). The detection current may be configured as a current sink (NMOS output). This configuration example (sixth modification) will be described with reference to FIG. 23. FIG. 23 is a circuit diagram illustrating a current detection circuit of a low-side driver of the sixth modification.

In the current detection circuit 12LF of the sixth modification, the output voltage of the first operational amplifier A1 is supplied to the gate of the transistor MN21 as a current control transistor. The transistor MN21 is comprised of an N-channel MOS transistor of low withstand voltage and provided in series to the transistor MN3 on the current path between the output terminal Tout and the terminal Td. With the configuration, the detection current (Isig) can be configured as a current sink.

Seventh Modification

Figure 24:
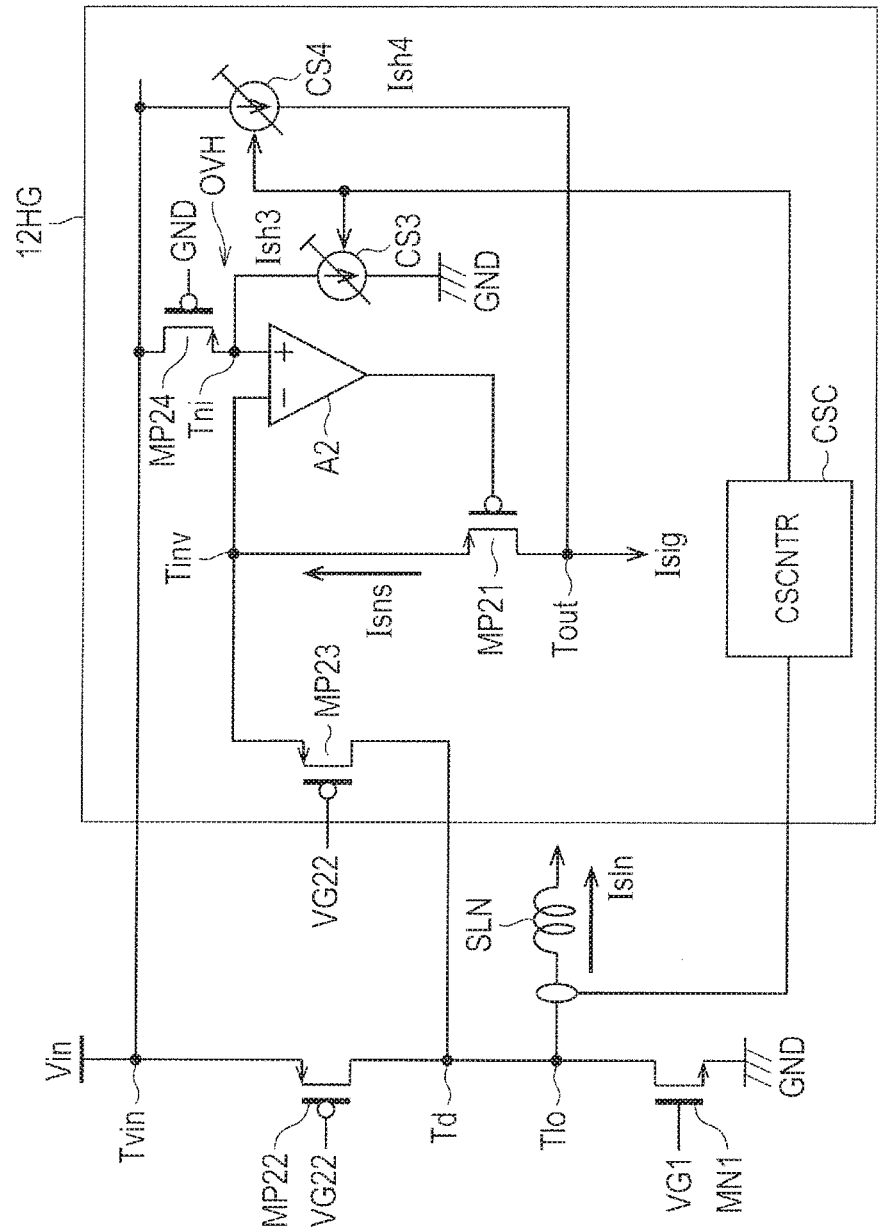
FIG. 24 is a circuit diagram illustrating a current detection circuit of a high-side driver of a seventh modification.

Although the current detection circuits of the low-side drivers have been described in the foregoing example and the first to sixth modifications, an example of a current detection circuit of a high-side driver (seventh modification) will be described with reference to FIG. 24. FIG. 24 is a circuit diagram illustrating a current detection circuit of a high-side driver of a seventh modification.

A current detection circuit 12HG of a high-side driver of the seventh modification is obtained by replacing the N-channel MOS transistors of the transistors MN3, MN4, and MN21 of the current detection circuit 12LF of the low-side driver of the sixth modification of FIG. 23 by PMOS channel MOS transistors and replacing the N-channel MOS transistors configuring the first operational amplifier A1, the first current source CS1, and the second current source CS2 by PMOS channel MOS transistors.

As illustrated in FIG. 24, the current detection circuit 12HG has transistors MP21, MP23, and MP24, a second operational amplifier A2, a third current source CS3, a fourth current source CS4, and a current source control circuit CSC. The high-side driver of the drive circuit 11 of the seventh modification is comprised of a P-channel MOS transistor MP22.

In the current detection circuit 12HG, the transistor MP23 is a sense transistor comprised of a P-channel MOS transistor of high withstand voltage which is the same as that of the transistor MP22. For example, the transistor size of the transistor MP23 is 1/N (for example, N=1000) of that of the transistor MP22.

The transistor MP23 is provided on the current path between the inversion input terminal Tinv of the second operational amplifier A2 and the drain (terminal Td) of the transistor MP22, and a pulse signal (VG22) is supplied to the gate. The pulse signal (VG22) is a signal of the same phase as that of the pulse signal (VG1) except for deadtime.

The second operational amplifier A2 amplifies the potential difference between the voltage supply circuit OVH supplying voltage lower than the source voltage (that is, the input voltage (Vin)) of the transistor MP22 and the source voltage of the transistor MP23. The second operational amplifier A2 is comprised of a transistor of low withstand voltage.

The gate-source voltage and the drain-source voltage of the transistor MP23 have the same values as those of the gate-source voltage and the drain-source voltage of the transistor MP22, respectively. Consequently, between the drain and the source of the transistor MP23, current (in the embodiment, current of 1/N (for example, N=1000)) proportional to the current flowing between the drain and the source of the transistor MP22 flows with precision.

The output voltage of the second operational amplifier A2 is supplied to the gate of the transistor MP21 as a current control transistor. The transistor MP21 is comprised of a P-channel MOS transistor of low withstand voltage and provided in series to the transistor MP23 on the current path between the output terminal Tout and the terminal Td.

As described above, the voltage supply circuit OVH supplying voltage lower than the input voltage (Vin) to the non-inversion input terminal Tni which is coupled to the input voltage terminal Tvin as one of the two input terminals of the second operational amplifier A2 is further provided. The voltage supply circuit OVH has the transistor MP24 and the first current source CS1.

The transistor MP24 is comprised of, for example, a P-channel MOS transistor of high withstand voltage of the same size as that of the transistor MP23. The transistor MP24 is provided between the non-inversion input terminal Tni of the second operational amplifier A2 and the input voltage terminal Tvin and, when the grounding voltage (GND) is supplied to the gate, is always in an on state. That is, the transistor MP24 functions as a resistive element.

The third current source CS3 is provided between the input voltage terminal Tvin and the non-inversion input terminal Tni of the second operational amplifier A2 and draws current (Ish2) from the non-inversion input terminal Tni of the second operational amplifier A2. Consequently, voltage lower than the input voltage (Vin) by predetermined voltage is supplied to the non-inversion input terminal Tni of the second operational amplifier A2.

By the influence of the offset voltage of the second operational amplifier A2, there is originally a case that the source voltage of the transistor MP23 should become higher than the drain voltage. However, if the voltage supply circuit OVH is not provided, the voltage of the inversion input terminal Tinv of the second operational amplifier A2 cannot become voltage higher than the input voltage (Vin) which is supplied to the non-inversion input terminal Tni, so that the source voltage of the transistor MP23 does not become higher than expected. As a result, the current detection in which the influence of an offset voltage is considered cannot be performed.

On the other hand, the current detection circuit 12HG supplies the voltage lower than the input voltage (Vin) to the non-inversion input terminal Tni of the first operational amplifier A1 by using the voltage supply circuit OVL. By the operation, the current detection circuit 12HG can make the source voltage of the transistor MP23 higher than the drain voltage as expected in accordance with the influence of the offset voltage, so that current detection in which the offset voltage is considered can be performed.

As described above, the transistor MP23 detects 1/N (for example, N=1000) of the current flowing in the transistor MP22. The detected current (Isns) is output as the detection current (Isig) as current sink by the transistor MP21.

The third current source CS3 and the fourth current source CS4 have the role of intentionally adding an offset to the detection current. Since the voltage at a virtual reference point of the second operational amplifier A2 drops when the current (Ish3) of the third current source CS3 is passed to the transistor MP24, the current flowing in the transistor MP23 decreases/increases, and a negative offset is applied.

When a negative offset is applied by the current (Ish3) of the third current source CS3, even when the solenoid current (Isln) does not flow (Isln=0 A), the virtual reference point of the second operational amplifier A2 becomes voltage lower than the input voltage (Vin), so that the current can be detected correctly.

Since the current (Ish4) of the fourth current source CS4 is added to the detection current (Isig), a positive offset is applied. When Ish1 becomes 0 A in accordance with increase of the solenoid current (Isln), no offset is applied and an error occurs. However, by applying a positive offset by the current (Ish4) of the fourth current source CS4, the error can be cancelled.

Eighth Modification

Figure 25:
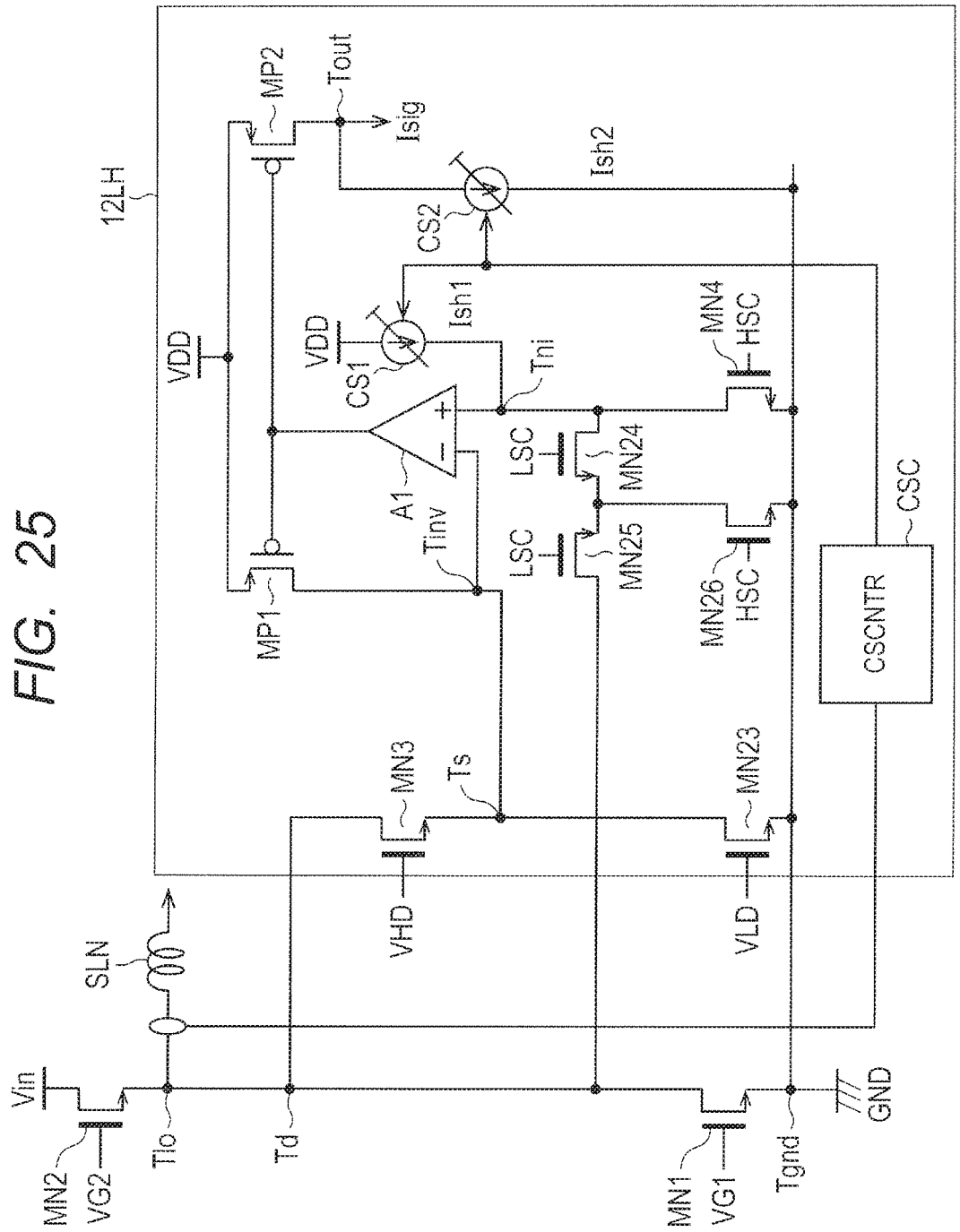
FIG. 25 is a circuit diagram illustrating a current detection circuit of a low-side driver of an eighth modification.
Figure 26:
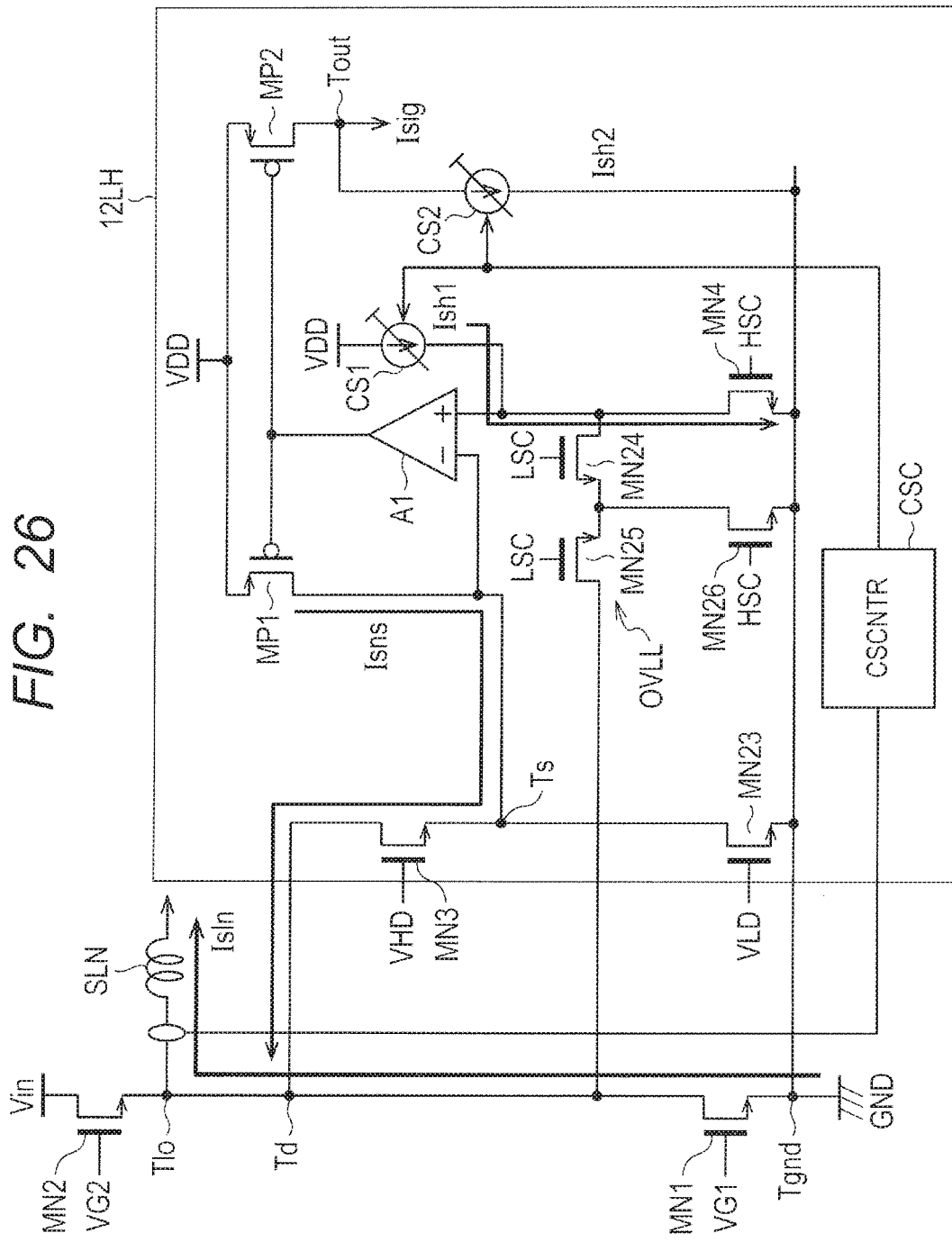
FIG. 26 is a diagram illustrating a current path of a high-side drive state in the current detection circuit of the low-side driver of FIG. 25.
Figure 27:
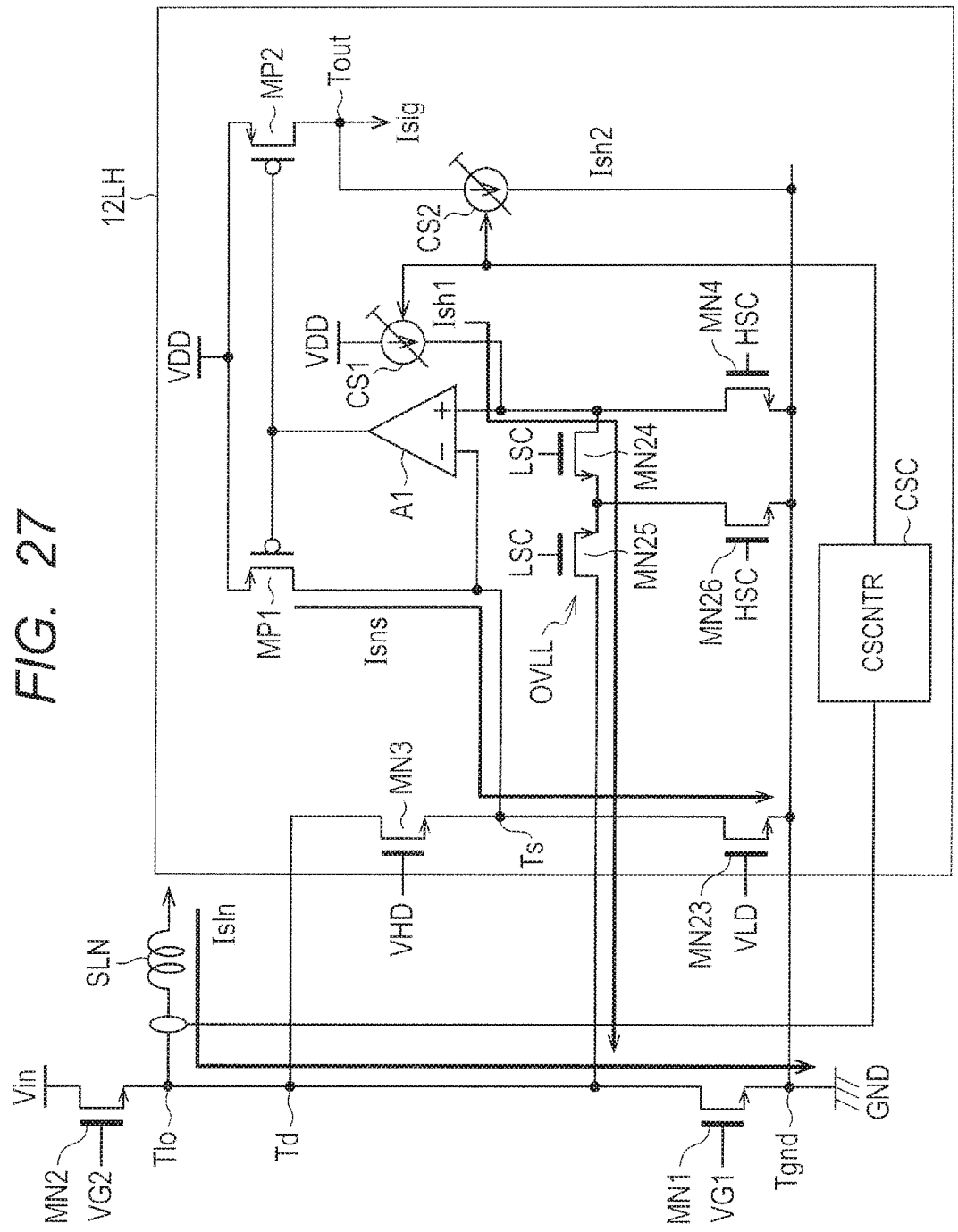
FIG. 27 is a diagram illustrating a current path of a low-side drive state in the current detection circuit of the low-side driver of FIG. 25.

An example (eighth modification) of a current detection circuit adapted to both high-side driving and low-side driving will be described with reference to FIGS. 25 to 27. FIG. 25 is a circuit diagram illustrating a low-side current detection circuit of the eighth modification. FIG. 26 is a diagram illustrating current paths of a high-side drive state in the low-side current detection circuit of FIG. 25. FIG. 27 is a diagram illustrating current paths of a low-side drive state in the low-side current detection circuit of FIG. 25.

As illustrated in FIG. 25, a current detection circuit 12LH of the eighth modification is obtained by further adding, to the current detection circuit 12L of the embodiment of FIG. 8, a transistor (second sense transistor) MN23 as a sense transistor for low-side driving, transistors (second shift transistors) MN24 and MN25 and a transistor MN26 configuring a part of a voltage supply circuit for low-side driving. The transistor MN3 operates and can be turned on at the time of high-side driving and the transistor MN23 operates and can be turned on at the time of low-side driving. The current detection circuit 12L can perform both current detection in the high-side driving state (FIG. 1B) as a first mode of the semiconductor device 10 and current detection in the low-side driving state (FIG. 1C) as a second mode.

The transistor MN23 is comprised of, for example, an N-channel MOS transistor of high withstand voltage of the same size as that of the transistor MN3. The transistor MN23 is provided between the inversion input terminal Tinv of the first operational amplifier A1 and the grounding voltage terminal Tgnd. The transistor MN23 is electrically coupled to the transistor MN3 at a contact Ts. The on/off of the transistor MN23 is controlled by a signal (VLD) of the same phase as that of the pulse signal (VG1). The signal (VLD) becomes high only in the low-side driving state. The on/off of the transistor MN3 is controlled by a signal (VHD) of the same phase as that of the pulse signal (VG1). The signal (VHD) becomes high only in the high-side driving state.

The transistors MN24 and MN25 are comprised of, for example, N-channel MOS transistors of high withstand voltage having a gate width which is twice as large as that of the transistor MN4. The transistors MN24 and MN25 are provided so as to form a current path in series between the non-inversion input terminal Tni of the first operational amplifier A1 and the drain of the transistor MN1, and a signal (LSC) indicating the low-side driving state is supplied to the gate. By coupling the transistors MN24 and MN25 in series, current can be prevented from flowing via body diodes of the transistors MN24 and MN25. In the case of configuring the transistors MN24 and MN25 by N-channel MOS transistors of high withstand voltage having a gate width which is twice as large as that of the transistor MN4, series resistance to the transistors MN24 and 25 can be made equivalent to the resistance of the transistor MN4.

The transistor MN26 is comprised of, for example, an N-channel MOS transistor of high withstand voltage of the same size as that of the transistor MN4. The transistor MN26 is provided between the source of the transistor MN24 and the source of the transistor MN25 and the grounding voltage terminal Tgnd, and a signal (HSC) indicating the high-side driving state is supplied to the gate.

In a manner similar to the embodiment, the transistor MN4 is provided between the non-inversion input terminal Tni of the first operational amplifier A1 and the grounding voltage terminal Tgnd, and a signal (HSC) indicating the high-side driving state is supplied to the gate.

As illustrated in FIG. 26, when the transistor MN1 is on in the high-side driving state, the transistors MN3 and MN4 are turned on and the transistors MN23 to MN25 are turned off, a coupling relation similar to that of the current detection circuit 12L of FIG. 8 is obtained, and similar operation is performed. In this state, the transistor MN26 is turned on, and the source of the transistor MN24 and the source of the transistor MN25 become the grounding voltage (GND).

On the other hand, in the high-side driving state, when the transistor MN2 is on, the transistor MN4 is turned on, and the transistor MN3 and the transistors MN23 to MN25 are turned off.

As illustrated in FIG. 27, when the transistor MN1 is on in the low-side driving state, the transistors MN23 and MN25 are turned on and the transistors MN3, MN4, and MN26 are turned off. By the above, the first operational amplifier A1 amplifies the potential difference between a voltage supply circuit OVLL supplying voltage higher than the drain voltage of the transistor MN1 and the drain voltage of the transistor MN23. The voltage supply circuit OVLL is comprised of the first current source CS1 and the transistors MN24 and MN25.

The gate-source voltage and the drain-source voltage of the transistor MP23 have the same values as those of the gate-source voltage and the drain-source voltage of the transistor MP22, respectively. Consequently, between the drain and the source of the transistor MP23, current (in the embodiment, current of 1/N (for example, N=1000)) proportional to the current flowing between the drain and the source of the transistor MP22 flows with precision.

In the low-side driving state, when the transistor MN2 is on, the transistors M3, MN4, and MN23 to MN26 are turned off.

In the modification, by switching the transistors which are turned on, the current detection in both of the high-side driving and the low-side driving can be performed.

By eliminating the transistors MN3, MN4, and MN26 related to the high-side driving of the modification, the low-side current detection circuit of the low-side driving may be obtained.

Ninth Modification

Figure 28:
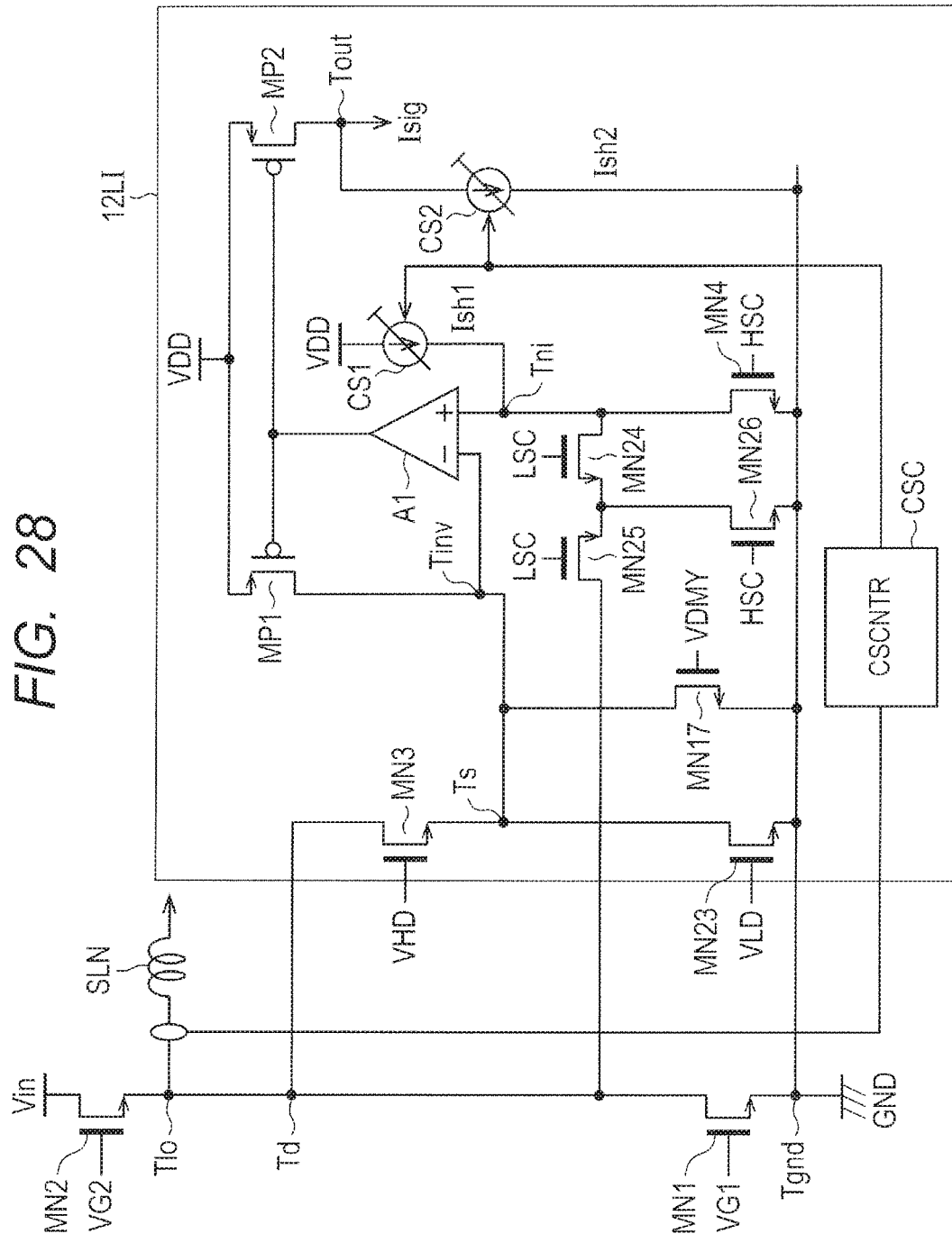
FIG. 28 is a circuit diagram illustrating a current detection circuit of a low-side driver of a ninth modification.
Figure 29:
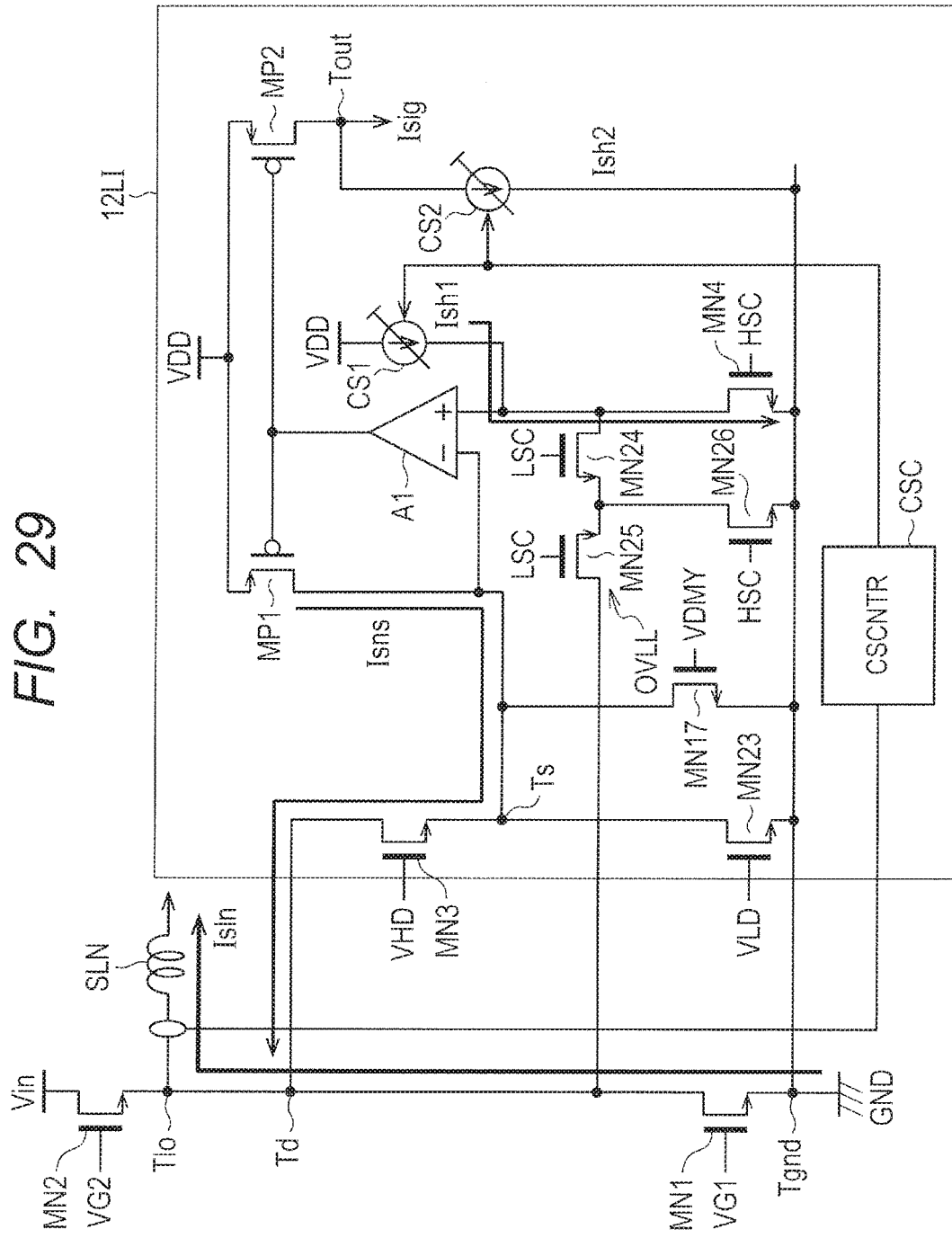
FIG. 29 is a diagram illustrating a current path in a high-side drive state in the current detection circuit of the low-side driver of FIG. 28.
Figure 30:
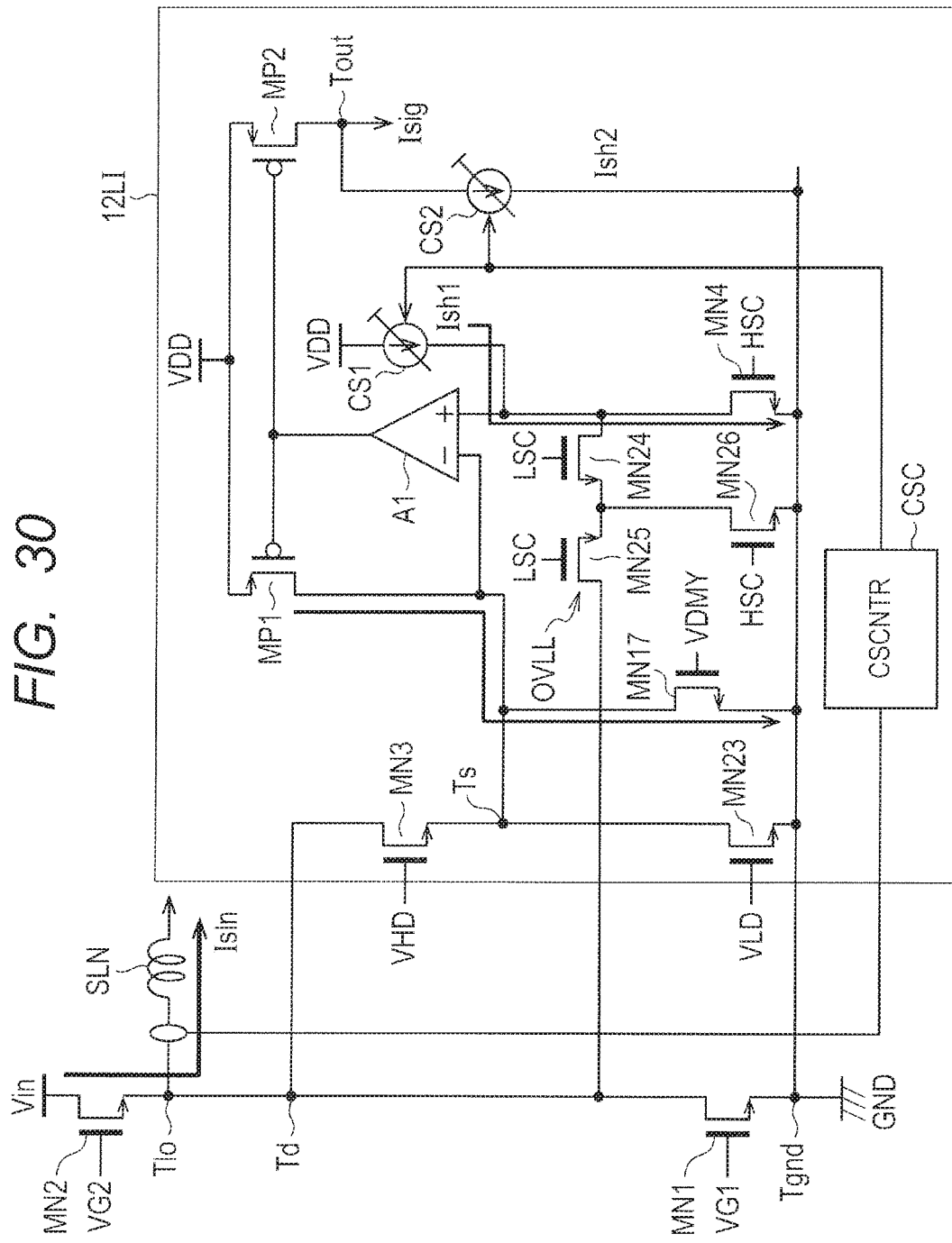
FIG. 30 is a diagram illustrating a current path in the high-side drive state in the current detection circuit of the low-side driver of FIG. 28.
Figure 31:
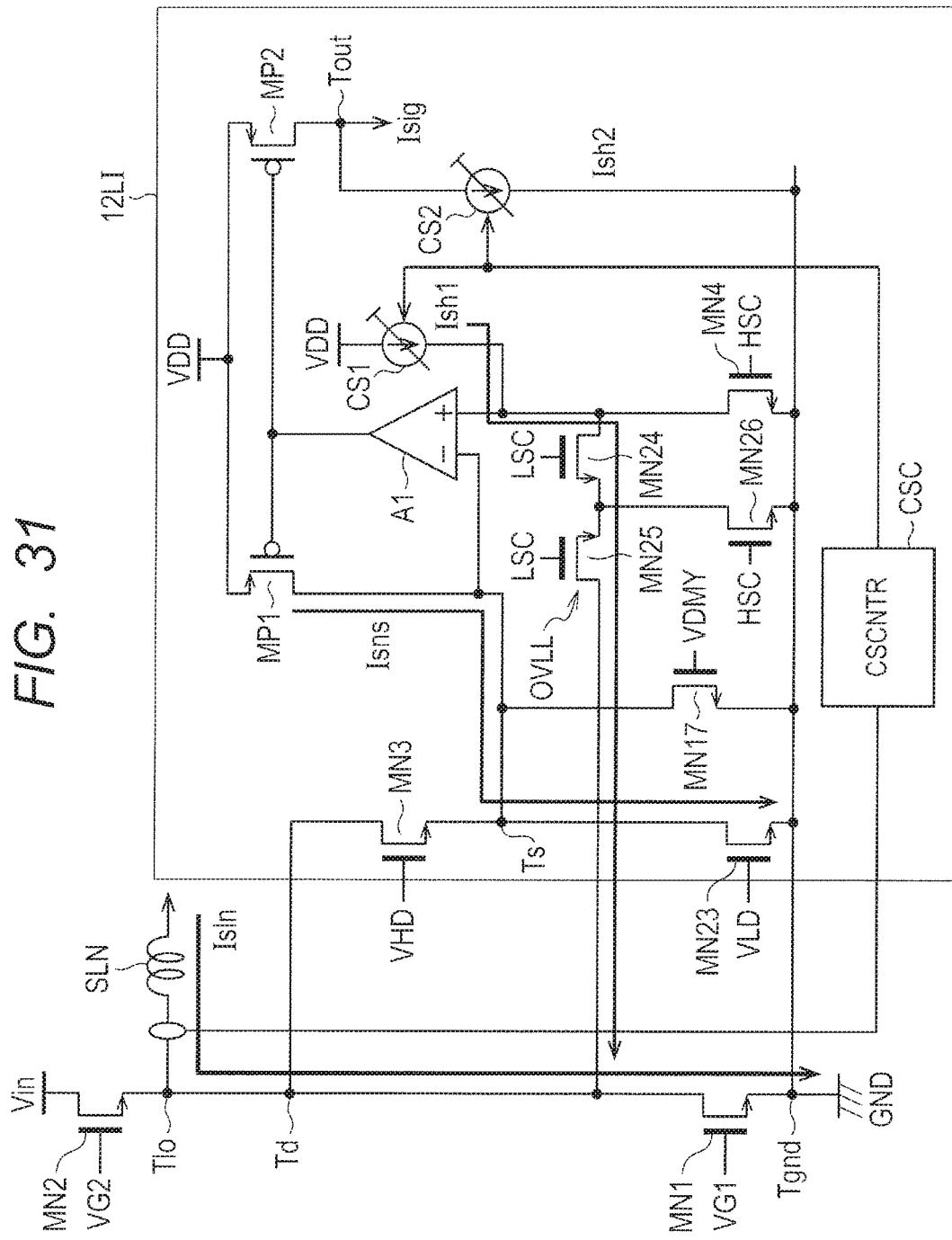
FIG. 31 is a diagram illustrating a current path in a low-side drive state in the current detection circuit of the low-side driver of FIG. 28.
Figure 32:
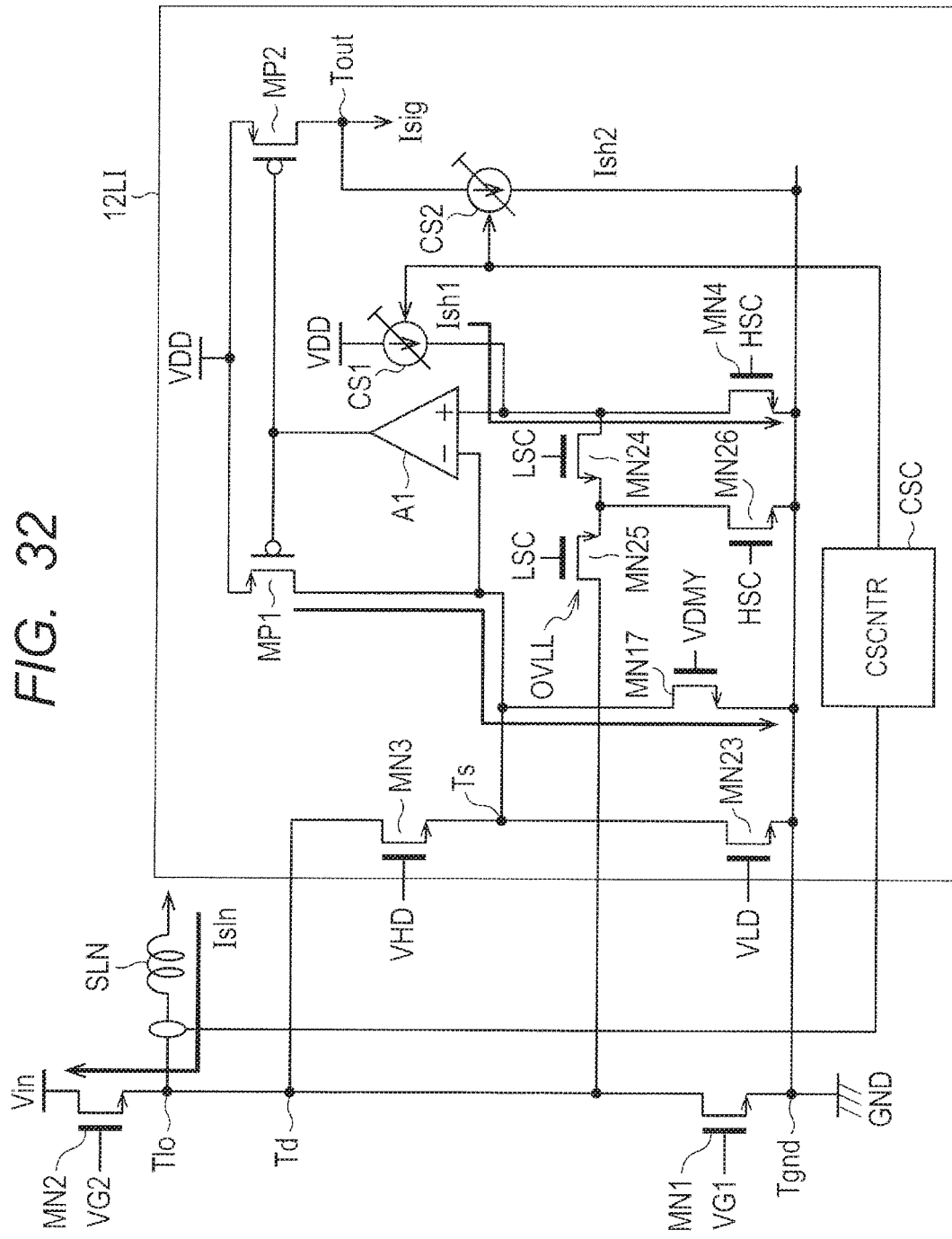
FIG. 32 is a diagram illustrating a current path in the low-side drive state in the current detection circuit of the low-side driver of FIG. 28.

When the transistor MN2 as a high-side driver is on in the high-side driving and the low-side driving of the current detection circuit 12LH of the eighth modification of FIG. 25, the transistors MN3 and MN23 are turned off. At this time, in a manner similar to the current detection circuit 12L of the embodiment, the load condition of the first operational amplifier A1 is different from that in the state where the transistor MN1 as a low-side driver is on. As a result, there is the possibility that response of the current detection circuit when the transistor MN1 is on becomes slow due to a transient response. The low-side current detection circuit of the ninth modification solving it will be described with reference to FIGS. 28 to 32. FIG. 28 is a circuit diagram illustrating a low-side current detection circuit of the ninth modification. FIG. 29 is a diagram illustrating current paths of a high-side drive state in the low-side current detection circuit of FIG. 28. FIG. 30 is a diagram illustrating current paths of the high-side drive state in the low-side current detection circuit of FIG. 28. FIG. 31 is a diagram illustrating current paths of a low-side drive state in the low-side current detection circuit of FIG. 28. FIG. 32 is a diagram illustrating current paths of the low-side drive state in the low-side current detection circuit of FIG. 28.

As illustrated in FIG. 28, the current detection circuit 12LI of the ninth modification is obtained by further adding, to the current detection circuit 12LH of the eighth modification of FIG. 25, the transistor (switch transistor) MN17 for passing current in the period in which the transistors MN1, MN3, and MN23 are off.

The transistor MN17 is comprised of, for example, an N-channel MOS transistor of high withstand voltage of the same size as that of the transistor MN3. The transistor MN17 is provided between the inversion input terminal Tinv of the first operational amplifier A1 and the grounding voltage terminal Tgnd. The on/off of the transistor MN17 is controlled by a signal (VDMY) of the same phase as that of the pulse signal (VG2) as an inversion signal of the pulse signal (VG1). That is, the on/off of the transistor MN17 is controlled complementarily with respect to the transistors MN2, MN3, and MN23. The resistance value when the transistor MN17 is on indicates the same value as the resistance value when the transistor MN3 is on. Since the other configuration of the current detection circuit 12LI is similar to that of the current detection circuit 12LH, the description will not be repeated.

As illustrated in FIG. 29, when the transistor MN1 is on in the high-side drive state, current flows in the transistor MN3. As illustrated in FIG. 30, when the transistor MN2 is on in the high-side drive state, current flows in the transistor MN17. Since the transistor MN17 is turned on even when the transistor MN3 is turned off, the load by the resistive element for the first operational amplifier A1 is maintained constant. That is, the load condition of the first operational amplifier A1 when the transistor MN1 is on and that when the transistor MN2 is on can be made the same by the transistor MN17. As a result, setting time of the first operational amplifier A1 after the on/off of the transistor MN3 is switched can be reduced, so that high-speed operation can be realized.

As illustrated in FIG. 31, when the transistor MN1 is on in the low-side state, current flows in the transistor MN23. As illustrated in FIG. 32, when the transistor MN2 is on in the low-side state, current flows in the transistor MN17. Since the transistor MN17 is turned on even when the transistor MN23 is turned off, the load by the resistive element for the first operational amplifier A1 is maintained constant. That is, the load condition of the first operational amplifier A1 when the transistor MN1 is on and that when the transistor MN2 is on can be made the same by the transistor MN17. As a result, setting time of the first operational amplifier A1 after the on/off of the transistor MN23 is switched can be reduced, so that high-speed operation can be realized.

By eliminating the transistors MN3, MN4, and MN26 related to the high-side driving of the modification, the low-side current detection circuit of the low-side driving may be obtained.

Although the present invention achieved by the inventors herein has been described concretely above on the basis of the embodiment, the example, and the modifications, obviously, the present invention is not limited to the foregoing embodiment, the example, and the modifications but can be variously changed without departing from the gist.

For example, the current detection circuit of the solenoid driver has been described in the example, the invention is not limited to the circuit. A current detection circuit of a DC-DC converter or a driver such as a motor driver may be also employed.

Although the example of configuring the drive circuit by the MOS transistor has been described in the example, the invention is not limited to the example. The drive circuit may be comprised of an IGBT (Insulated Gate Bipolar Transistor). In this case, the sense transistor is also comprised of an IGBT.

Although the example of forming the drive circuit by the same semiconductor chip as that of the current detection circuit and the control unit has been described in the example, the invention is not limited to the example. For example, the drive circuit may be formed in a semiconductor chip different from that of the current detection circuit and the control unit. It is also possible to form the drive circuit and the sense transistor in the same semiconductor chip and form the current detection circuit and the control unit except for the sense transistor on the same semiconductor chip.

Although the object to be detected by the current source control circuit CSC is one in the example and the second and third modifications, the number of objects to be detected may be plural. That is, it may be at least one of the solenoid current (Isln), the current of the low-side driver, and the current of the sense transistor.

Although the example of configuring each of the first operational amplifier A1 and the second operational amplifier A2 by the transistor of the low withstand voltage has been described, it may be comprised of a transistor of high withstand voltage. Although the example of configuring the transistors MP1 to MP14 and MP21 by the P-channel MOS transistors of low withstand voltage has been described, they may be comprised of P-channel MOS transistors of high withstand voltage. Although the example of configuring the transistors MN5 to MN16 and MN21 by N-channel MOS transistors of low withstand voltage has been described, they may be comprised of N-channel MOS transistors of high withstand voltage.

What is claimed is:

1. A semiconductor device comprising:
a drive circuit driving a load; and
a current detection circuit detecting current flowing in the drive circuit,
wherein the drive circuit comprises:
an external output terminal to which the load is coupled;
a first voltage terminal to which first voltage is supplied;
a first drive transistor which has a first electrode coupled to the external output terminal and a second electrode coupled to the first voltage terminal; and
wherein the current detection circuit comprises:
a power supply voltage terminal to which a power supply voltage is supplied;
a differential amplifier amplifying a potential difference between voltage of a first terminal and voltage of a second terminal;
a first sense transistor passing sense current between the first terminal and the first electrode of the first drive transistor;
a voltage supply circuit supplying voltage higher than voltage supplied to the first voltage terminal to the second terminal;
a third terminal outputting detection current;
a first current source coupled to the third terminal; and
a control circuit controlling supplying voltage of the voltage supply circuit and current of the first current source, and
wherein the detection current detected by the current detection circuit is current obtained by subtracting the current of the first current source from current based on the sense current.

2. The semiconductor device according to claim 1, the voltage supply circuit having, a second current source coupled between the power supply voltage terminal and the second terminal, and a fourth transistor coupled between the first voltage terminal and the second terminal,
wherein when the current based on the current flowing in the load is smaller than a predetermined value, the current of the second current source is larger than the current of the first current source and, when the current based on the current flowing in the load is equal to or larger than the predetermined value, the current of the first current source is larger than the current of the second current source.

3. The semiconductor device according to claim 2, wherein the control circuit detects current flowing from the external output terminal toward the load,
when the current based on the current flowing in the load is smaller than the predetermined value, the second current source passes current from the power supply voltage terminal to the second terminal and, when the current based on the current flowing from the external output terminal toward the load is equal to or larger than the predetermined value, the second current source does not pass current, and
wherein when the current based on the current flowing from the external output terminal toward the load is smaller than the predetermined value, the first current source does not pass current
and, when the current based on the current flowing from the external output terminal toward the load is equal to or larger than the predetermined value, the first current source passes current from the third terminal to the first voltage terminal.

4. The semiconductor device according to claim 2,
wherein the control circuit controls so as to increase the current based on the current flowing from the external output terminal toward the load and decrease the current of the second current source when the current based on the current flowing from the external output terminal toward the load is smaller than a predetermined value, and controls so as not pass current to the second current source when the current based on the current flowing from the external output terminal toward the load is equal to or larger than the predetermined value, and wherein the current source control circuit controls so as not to pass current to the first current source when the current based on the current flowing from the external output terminal toward the load is smaller than the predetermined value and controls so as to increase the current based on the current flowing from the external output terminal toward the load and increase the current of the first current source when the current based on the current flowing from the external output terminal toward the load is equal to or larger than the predetermined value.

5. The semiconductor device according to claim 1, wherein the load is a solenoid having one end coupled to the external output terminal and having another end to which grounding voltage is supplied.

6. The semiconductor device according to claim 1, wherein current based on current flowing from the external output terminal toward the load is current flowing in the first drive transistor.

7. The semiconductor device according to claim 1, wherein current based on current flowing from the external output terminal toward the load is current flowing in the first sense transistor.

8. The semiconductor device according to claim 2, further comprising a fourth terminal to which first voltage is supplied,
wherein the control circuit generates a first replica current and a second replica current as copies of current flowing in the first sense transistor,
wherein the control circuit having a third current source, wherein the second current source is coupled between the power supply voltage terminal and the fourth terminal and generates current by subtracting the first replica current from the current of the third current source, and
wherein the first current source is coupled between the third terminal and the fourth terminal and generates current by adding the second replica current to the current of the third current source.

9. The semiconductor device according to claim 1,
wherein the current detection circuit further comprises a fourth current source coupled between the third terminal and the first voltage terminal and subtracts current of the fourth current source from the detection current.

10. The semiconductor device according to claim 1, further comprising a drive circuit control unit controlling the drive circuit on the basis of the detection current,
wherein the drive circuit control unit has an analog/digital converter converting the detection current to a digital value.

11. The semiconductor device according to claim 10, wherein the control unit further comprises an addition circuit of subtracting a value corresponding to a voltage value supplied from the voltage supply circuit from the digital value.

12. The semiconductor device according to claim 1,
the drive circuit comprises:
an input voltage terminal to which input voltage is supplied,
a second drive transistor which sets a conductive state or a non-conductive state between the external output terminal and the input voltage terminal,
wherein the current detection circuit further comprises a switch transistor setting a conductive state or a non-conductive state between the first terminal and the first voltage terminal, and
wherein when the second drive transistor is in a conductive state, the switch transistor is in a conductive state.

13. The semiconductor device according to claim 1,
wherein the current detection circuit further comprises:
a first transistor coupled so as to form a current path between the power supply voltage terminal and the first terminal; and
a second transistor coupled so as to form a current path between the power supply voltage terminal and the third terminal, and
wherein an output of the differential amplifier is coupled to the gate of the first transistor and the gate of the second transistor, and the first and second transistors configure a current mirror circuit.

14. The semiconductor device according to claim 1,
wherein the current detection circuit further comprises a third transistor coupled so as to form a current path between the first terminal and the third terminal, and
wherein an output of the first differential amplifier is coupled to the gate of the third transistor.

15. The semiconductor device according to claim 1,
wherein the current detection circuit further comprises a second sense transistor passing sense current between the first terminal and the first voltage terminal,
wherein the voltage supply circuit comprises:
a first shift transistor setting a conductive state or a non-conductive state between the second terminal and the first voltage terminal; and
a second shift transistor setting a conductive state or a non-conductive state between the second terminal and the first drive transistor, and
wherein when the semiconductor device operates in a first mode, the first shift transistor enters the conductive state and, when the semiconductor device operates in a second mode, the second shift transistor enters the conductive state.

16. The semiconductor device according to claim 15, wherein in the first mode, one end of a solenoid is coupled to the external output terminal, and grounding voltage is supplied to the other end of the solenoid.

17. The semiconductor device according to claim 15, wherein in the second mode, one end of a solenoid is coupled to the external output terminal, and power supply voltage is supplied to the other end of the solenoid.

18. The semiconductor device according to claim 15,
the drive circuit comprises:
an input voltage terminal to which input voltage is supplied,
a second drive transistor which sets a conductive state or a non-conductive state between the external output terminal and the input voltage terminal,
wherein the current detection circuit further comprises a switch transistor for setting a conductive state or a non-conductive state between the first terminal and the first voltage terminal, and
wherein when the second drive transistor is in the conductive state, the switch transistor is set to the conductive state.

19. A current detecting method comprising the steps of:
passing current to a first driver transistor having, a first electrode coupled to an external output terminal to which a load is coupled, and a second electrode coupled to a first voltage terminal to which first voltage is supplied;
passing sense current to a first sense transistor coupled between a first terminal of a differential amplifier amplifying a potential difference between voltage of the first terminal and voltage of a second terminal and the first electrode of the first drive transistor;
supplying voltage higher than the first voltage to the second terminal;
passing current from a first current source coupled to a third terminal outputting detection current to the first voltage terminal; and
detecting value of current flowing in the first drive transistor obtaining the detection current by subtracting current of the first current source from the current based on the sense current.

20. A load drive system comprising:
a load;
a semiconductor device driving the load; and
a semiconductor integrated circuit device controlling the semiconductor device,
wherein the semiconductor device comprises:
a drive circuit having an external output terminal to which the load is coupled, a first voltage terminal to which first voltage is supplied, an input voltage terminal to which input voltage is supplied, a first drive transistor having a first electrode coupled to the external output terminal and, a second electrode coupled to the first voltage terminal, and a second drive transistor coupled to the external output terminal and the input voltage terminal; and
a current detection circuit having a power supply voltage terminal to which a power supply voltage is supplied, a differential amplifier amplifying a potential difference between voltage of a first terminal and voltage of a second terminal, a first sense transistor passing sense current between the first terminal and the first electrode of the first drive transistor, a voltage supply circuit supplying voltage to the second terminal higher than voltage supplied to the first voltage terminal,
a third terminal outputting detection current, a first current source coupled between the third terminal and the first voltage terminal; and a control circuit controlling voltage of the voltage supply circuit and current of the first current source, and
wherein the detection current detected by the current detection circuit is current obtained by subtracting the current of the first current source from the current based on the sense current.

* * * * *